United States Patent [19]
Shirai et al.

[11] Patent Number: 5,734,292
[45] Date of Patent: Mar. 31, 1998

[54] INTERMEDIATE POTENTIAL GENERATION CIRCUIT

[75] Inventors: Yutaka Shirai; Toshiki Hisada; Hiroyuki Koinuma, all of Yokohama, Japan

[73] Assignee: Kabushiki Kaisha Toshiba, Kawasaki, Japan

[21] Appl. No.: 520,773

[22] Filed: Aug. 30, 1995

[30] Foreign Application Priority Data

Aug. 30, 1994 [JP] Japan ................... 6-205188

[51] Int. Cl.$^6$ ................................. G05F 1/10
[52] U.S. Cl. .................. 327/541; 327/540; 327/543; 327/546; 323/313
[58] Field of Search .................. 327/538, 540, 327/541, 543, 546; 323/313, 315

[56] References Cited

U.S. PATENT DOCUMENTS

| | | | |
|---|---|---|---|
| 4,117,353 | 9/1978 | Butler et al. | 327/538 |
| 4,663,584 | 5/1987 | Okada et al. | 323/313 |
| 4,812,735 | 3/1989 | Sawada et al. | 323/313 |
| 4,906,914 | 3/1990 | Ohsawa | 327/535 |
| 5,305,259 | 4/1994 | Kim | 327/540 |
| 5,369,354 | 11/1994 | Mori | 323/313 |
| 5,436,552 | 7/1995 | Kajimoto | 323/313 |
| 5,532,578 | 7/1996 | Lee | 323/313 |
| 5,534,817 | 7/1996 | Suzuki et al. | 327/545 |

FOREIGN PATENT DOCUMENTS 5-327455  12/1993  Japan ................... 327/541

*Primary Examiner*—Terry Cunningham
*Attorney, Agent, or Firm*—Banner & Witcoff, Ltd.

[57] ABSTRACT

The gate of an NMOS transistor receives a reference potential, and the source is connected to an output node. A load element is provided between the drain of this transistor and a power supply. First and second inverter circuits sequentially invert a drain potential of the NMOS transistor and transfer it to the gate of a PMOS transistor. The source of the PMOS transistor is connected to a power supply, and the drain is connected to the output node. When the potential of the output node becomes lower than a reference potential, the PMOS transistor is activated until the outputs from the inverter circuits are inverted, thereby charging the output node with a large current.

29 Claims, 12 Drawing Sheets

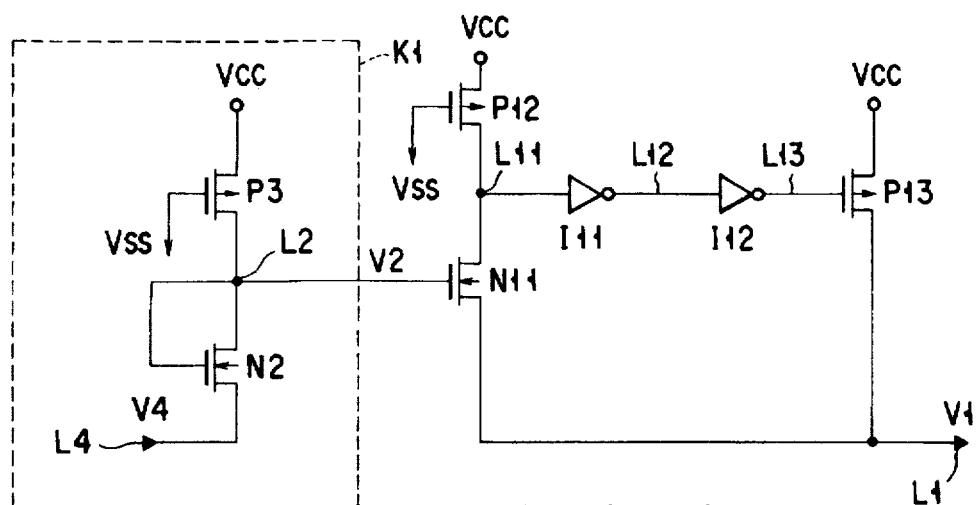
F I G. 4
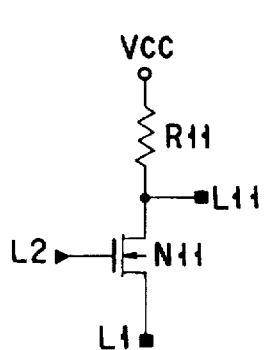
F I G. 5A
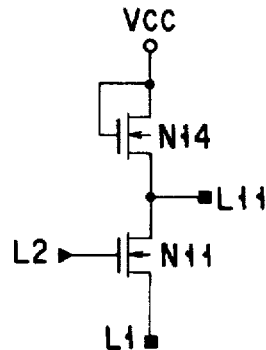
F I G. 5B
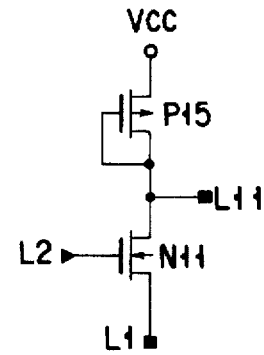
F I G. 5C
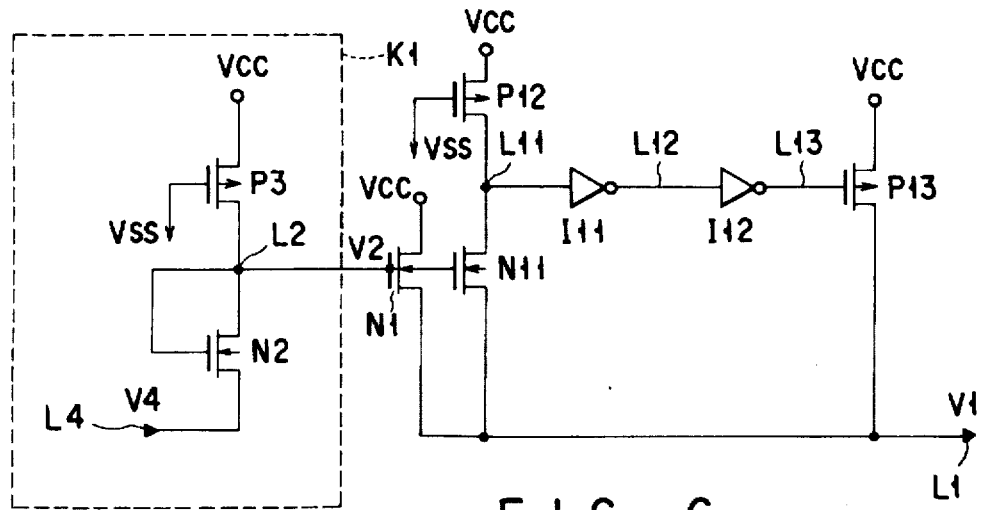
F I G. 6

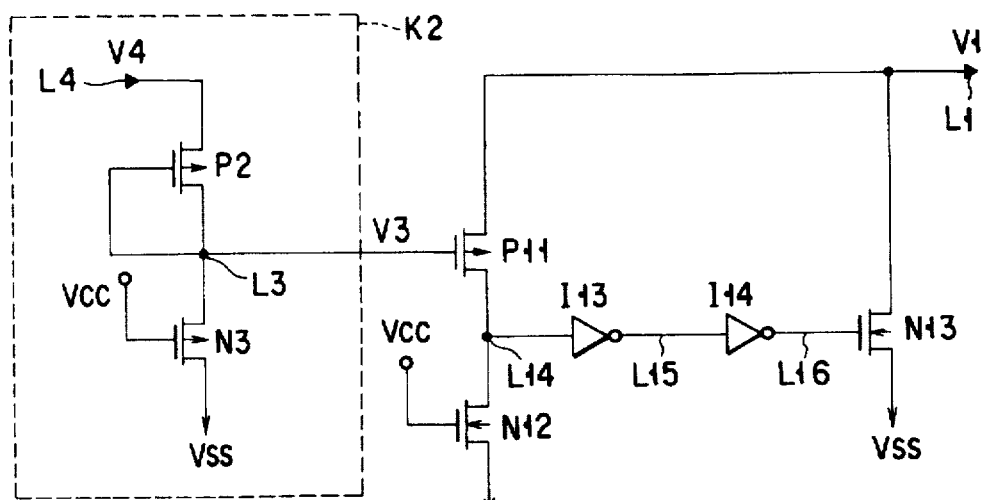
F I G. 7
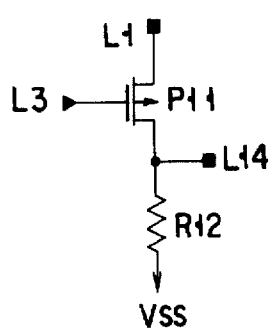
F I G. 8A
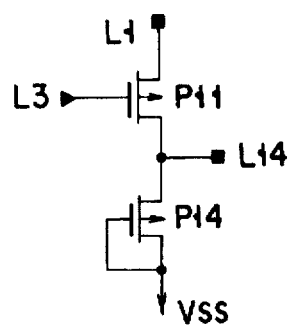
F I G. 8B
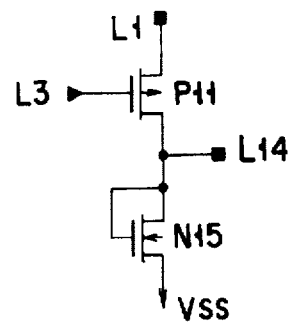
F I G. 8C
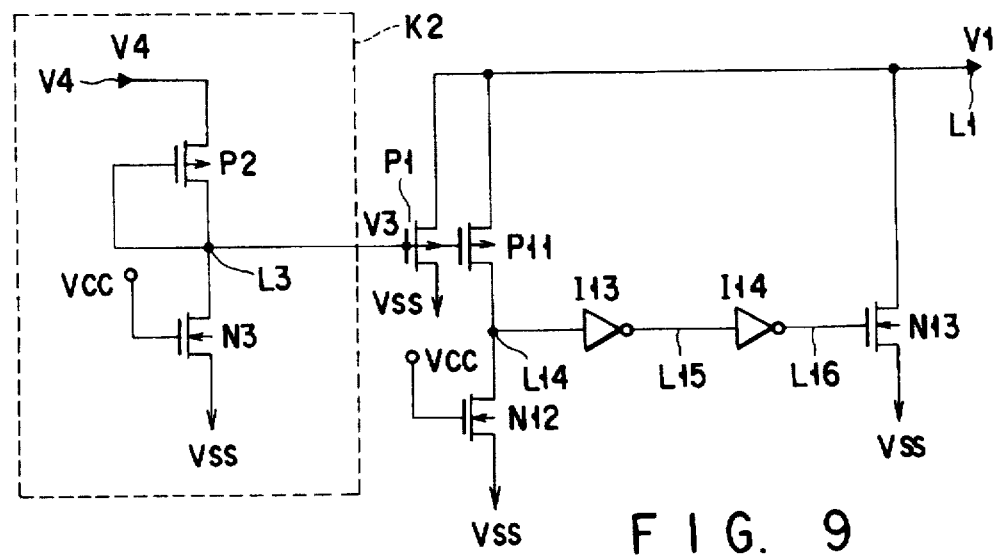
F I G. 9

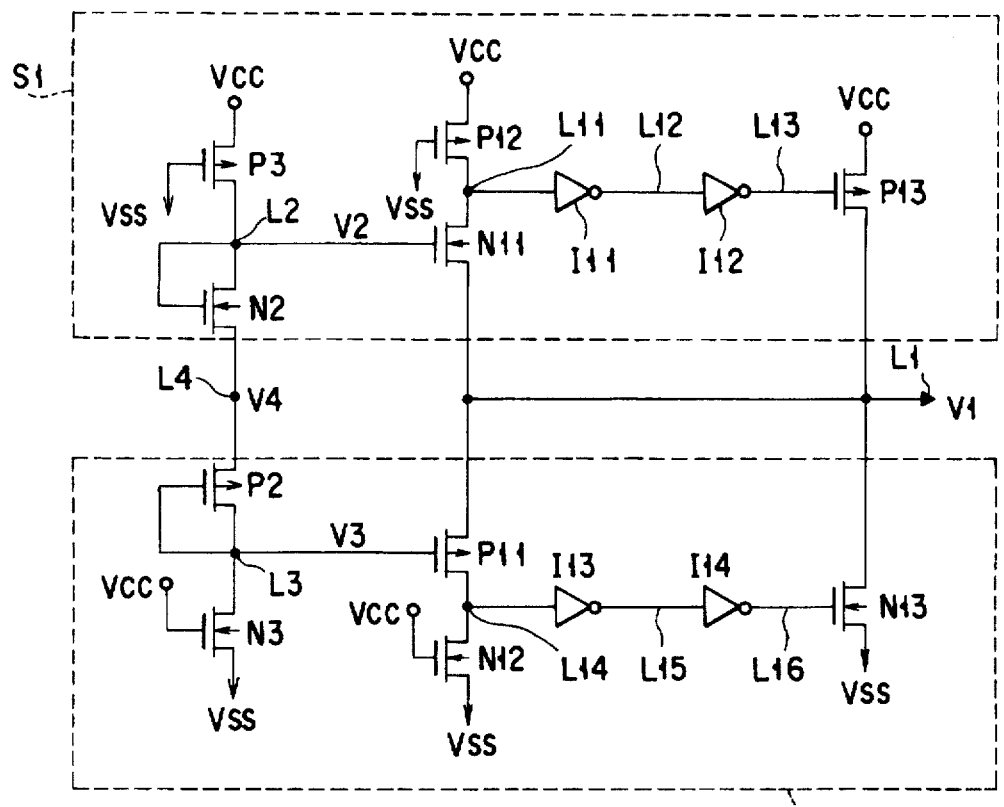
F I G. 10
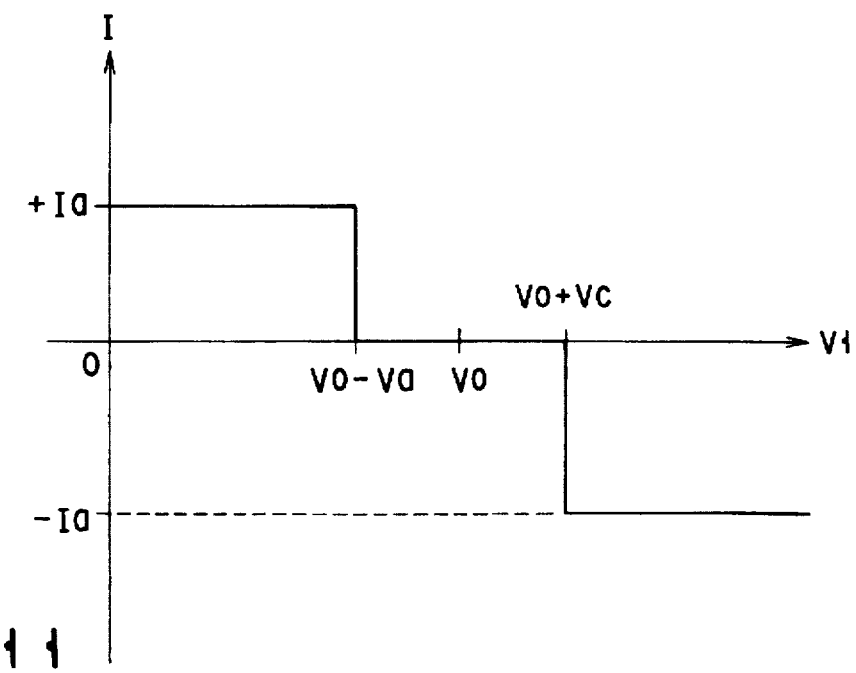
F I G. 11

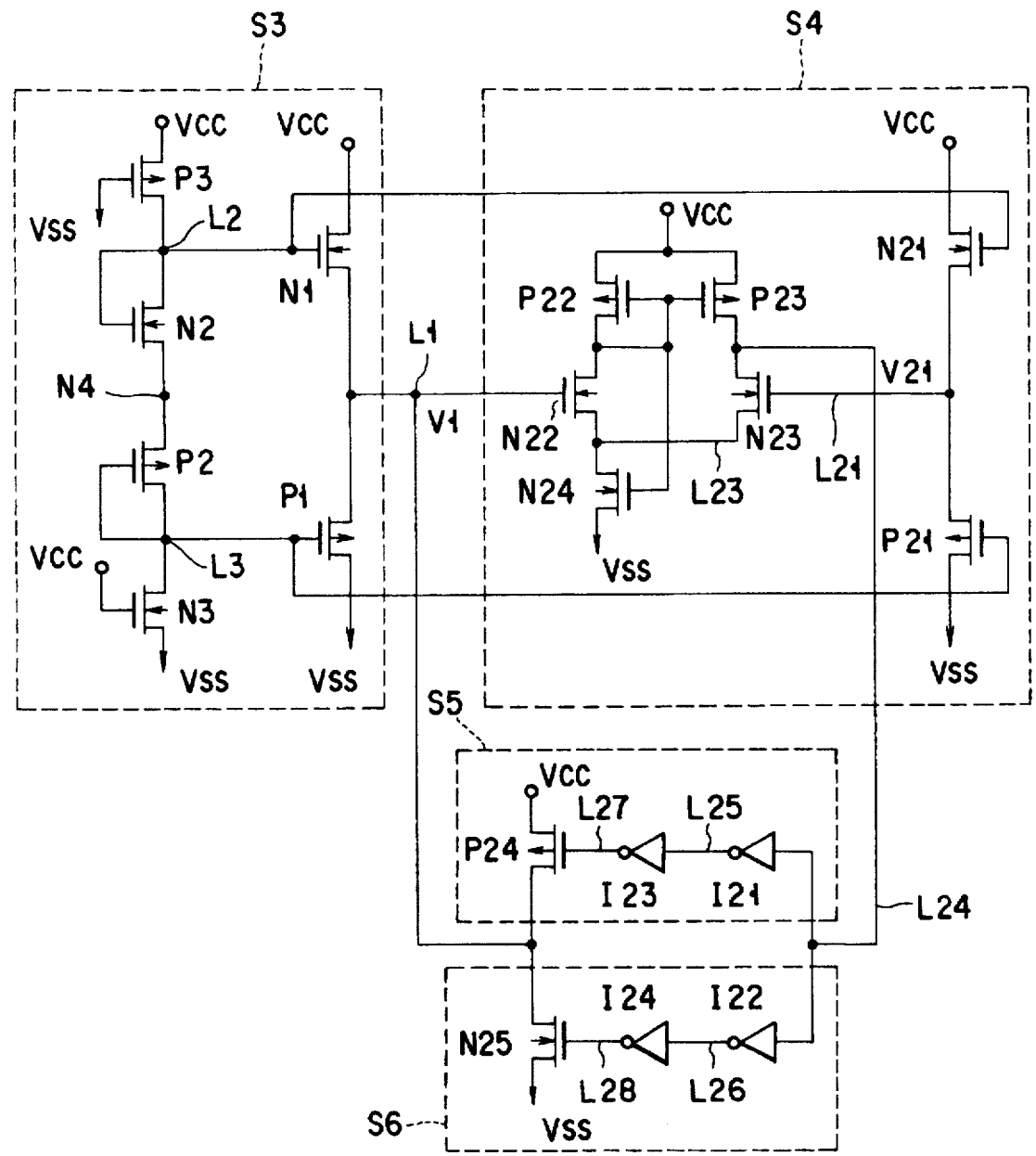
F I G. 17

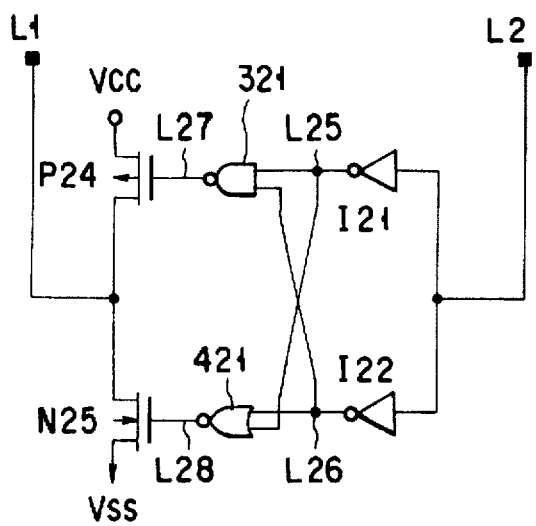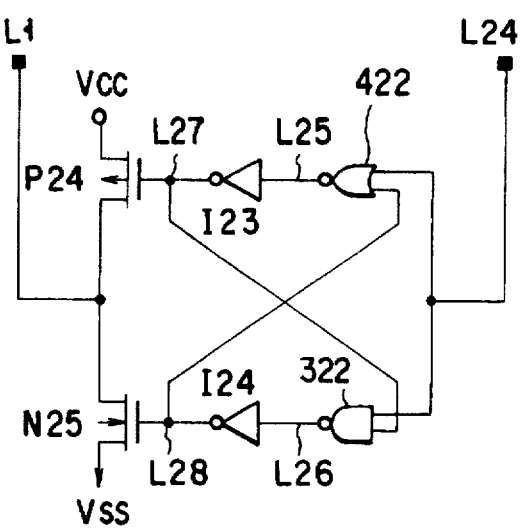
F I G. 20A    F I G. 20B
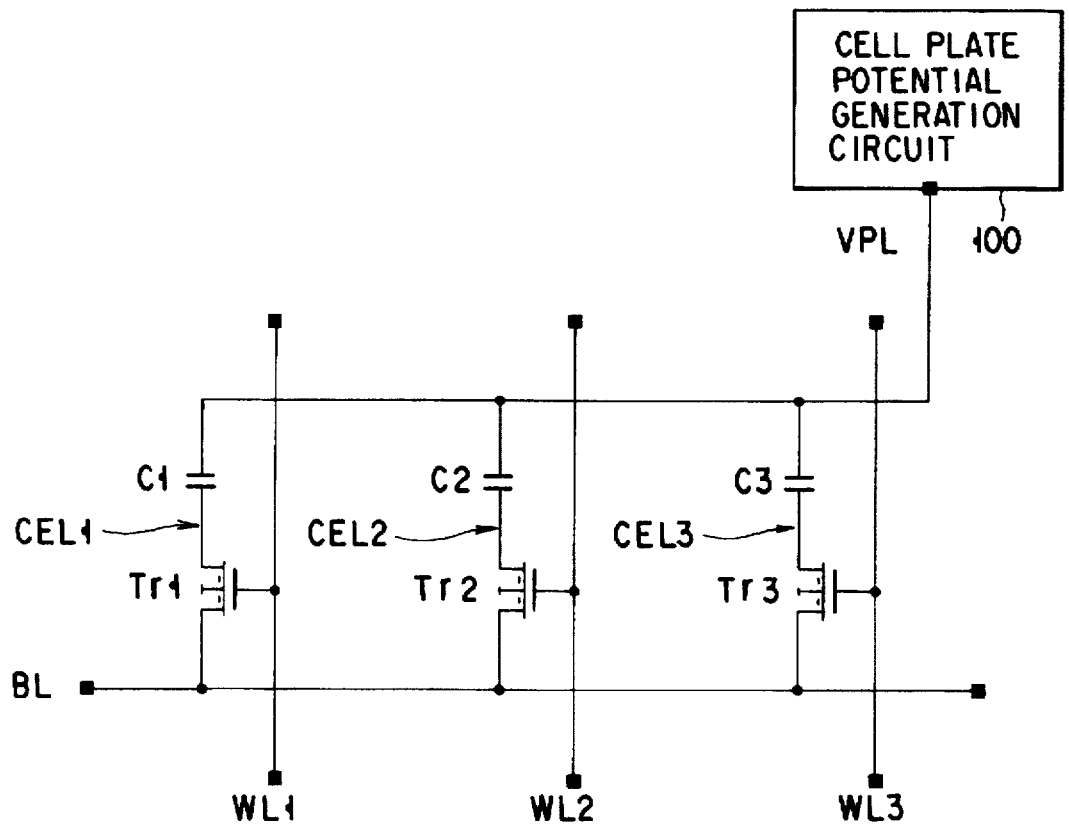
F I G. 21

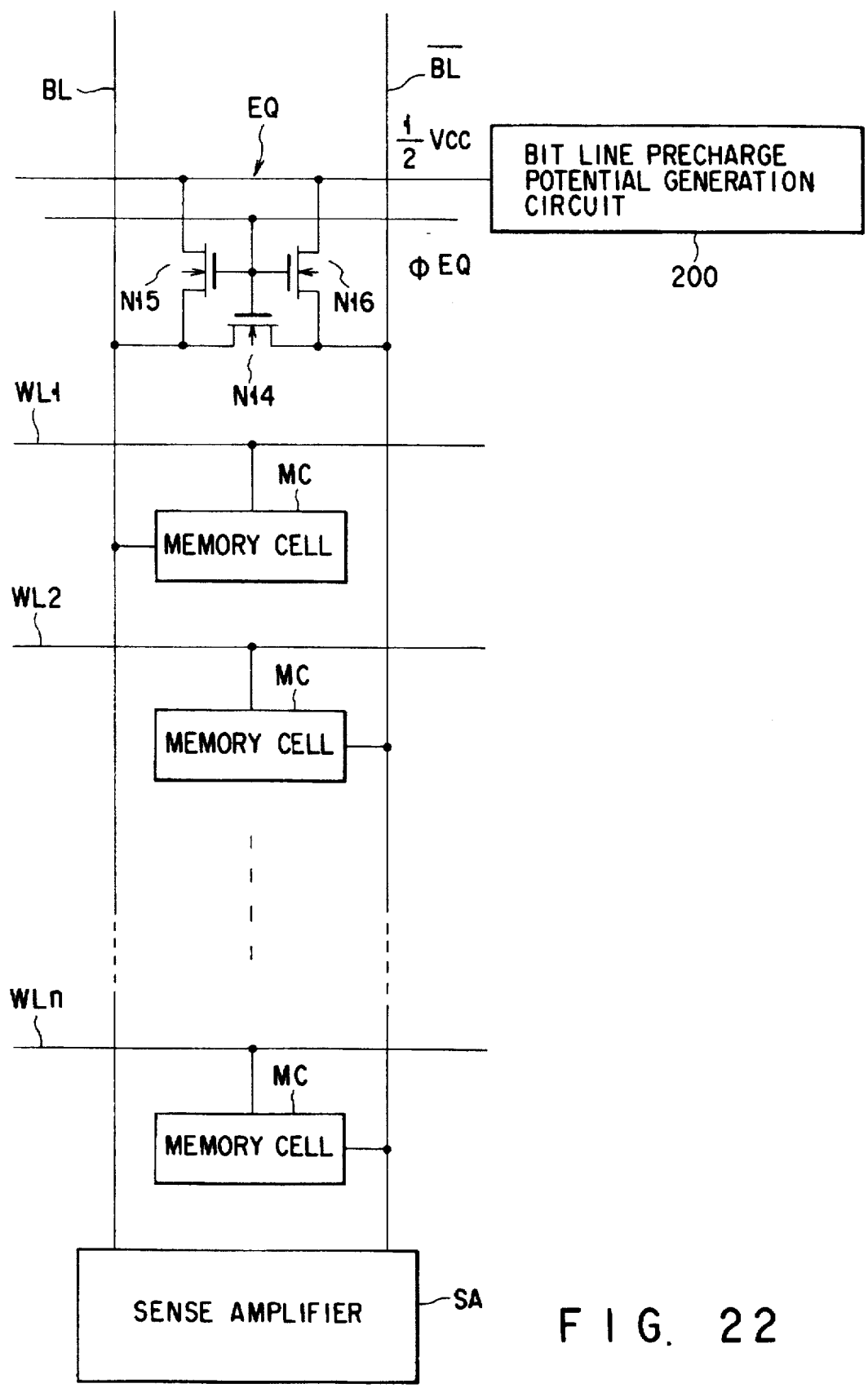
F I G. 22

INTERMEDIATE POTENTIAL GENERATION CIRCUIT

BACKGROUND OF THE INVENTION

1. Field of the Invention

The present invention relates to a semiconductor integrated circuit and, more particularly, to an intermediate potential generation circuit used for a DRAM cell plate potential generation circuit, a DRAM bit line precharge potential generation circuit, or the like.

2. Description of the Related Art

An intermediate potential generation circuit of this type is described in, e.g., U.S. Pat. No. 4,663,584.

The intermediate potential generation circuit described in U.S. Pat. No. 4,663,584 charges/discharges an output node to generate a stable DC intermediate potential. This circuit, however, does not have satisfactory response characteristics against transient variations in intermediate potential because the intermediate potential generation circuit has voltage-current characteristics shown in FIG. 1. More specifically, assume that the variation amount of an output intermediate potential is small, and a potential difference between the drain and gate potentials of a P-channel MOS transistor (to be referred to as a PMOS transistor hereinafter) for charging the output node is an almost threshold voltage thereof (about $V=V0-Va$ in FIG. 1), and that the variation amount of an output intermediate potential, and a potential difference between the drain and gate potentials of an N-channel MOS transistor (to be referred to as an NMOS transistor hereinafter) for discharging the output node is an almost threshold voltage thereof (about $V=V0+Vc$ in FIG. 1). In this case, the charge and discharge currents are small due to the transistor characteristics of the PMOS and NMOS transistors. Charge and discharge operations are started in sufficiently large current amounts with an increase in variation amount of the output intermediate potential ($I=\pm Ib$ at $V=V0-Vb$, and $V0+Vd$ in FIG. 1). To sufficiently assure the charge and discharge currents with a small variation amount of an output potential, the PMOS and NMOS transistors must be increased in size. When the transistor size is increased, an excessive current flows with a large variation in output potential, and the output potential is set in an unstable state. The charge and discharge transistors cannot be increased in size beyond an allowable range.

As described above, since the conventional intermediate potential generation circuit sets an output potential to an intermediate potential using the transistor characteristics of the PMOS and NMOS transistors, the generation circuit has a large time constant in recovering a potential variation. For this reason, when a new variation occurs before a desired potential is not perfectly recovered, the set potential may not be maintained. As an example, an output potential variation occurring when the conventional intermediate potential generation circuit is used as a cell plate potential generation circuit will be described with reference to FIGS. 2 and 3.

FIG. 2 is a circuit diagram showing only some memory cells in a DRAM and a cell plate potential generation circuit (to be referred to as a VPLG hereinafter). This VPLG is arranged to set a cell plate potential (VPL). Memory cells comprise a cell transistor Tr1 and a cell capacitor C1, a cell transistor Tr2 and a cell capacitor C2, and a cell transistor Tr3 and a cell capacitor C3, respectively. Word lines WL1 to WL3 are connected to the gates of the cell transistors Tr1 to Tr3, respectively. A bit line BL is commonly connected to the drains of the cell transistors Tr1 to Tr3. Although not shown, a sense amplifier and a precharge potential generation circuit are connected to an end of the bit line BL. In an initial state, a power supply potential, a cell plate potential VPL, the word lines WL1 to WL3, and the bit line BL are set at 4 V, 2 V, "L" level, and a precharge potential (VBL), respectively, and "L" level is written in each of cell storage nodes CEL1 to CEL3.

As shown in FIGS. 3A-3I, when the power supply voltage increases from 4 V to 6 V from time $t_1$ to time $t_2$, the cell plate potential VPL increases from 2 V to 3 V due to the power supply voltage dependency. At this time, the potential of each of the cell storage nodes CEL1 to CEL3 also increases from "L" level due to coupling with the cell plate potential VPL through a corresponding one of the capacitors C1 to C3. In this state, a refresh operation is started. The word line WL1 is boosted at time $t_3$ to drive the cell transistor Tr1, the potential of the cell storage node CEL1 flows out to the bit line BL, and the potential of the bit line BL becomes slightly lower than the precharge potential VBL. At time $t_4$, a sense amplifier (not shown) is then driven to cause the level of the bit line BL to gradually fall to "L" level. The level of the cell storage node CEL1 is also caused to fall to "L" level following the decrease in potential of the bit line BL, thereby performing a refresh operation. At this time, the cell plate potential VPL is slightly decreased by coupling through the capacitor C1. The level of the word line WL1 then returns to "L" level to return the bit line BL to the precharge potential, thereby completing one cycle.

Similarly, when the word line WL2 is boosted at time $t_7$ to refresh the cell storage node CEL2, the cell plate potential VPL is slightly decreased again by coupling through the capacitor C2. The cell plate potential VPL is decreased by the refresh operation of the cell storage node CEL3 which is to be started from time $t_{11}$. When the cell storage nodes are sequentially refreshed, the cell plate potential VPL gradually decreases.

In the state-of-the-art DRAM, several millions or ten millions of memory cells are present on one chip. It takes about several hundreds to thousands of cycles to refresh all the cells. For this reason, a decrease in the cell plate potential VPL cannot be neglected.

The VPLG performs a charge operation for the above-mentioned decrease in cell plate potential VPL. The cell plate potential VPL is rarely recovered within one refresh cycle with respect to a small variation in cell plate potential VPL because the time constant in the recovery operation is large. However, when the cell plate potential VPL gradually decreases to increase the total VPL variation amount, the charge current increases. The VPL is stabilized at a potential when a decrease in VPL becomes equal to an increase in VPL in the recovery operation.

A problem posed when the cell plate potential VPL varies from a set value will be described below. Assume that a voltage of 4 V is applied to a cell storage node as "H" data. When the cell plate VPL is decreased by 1 V in the above process, the potential of the cell storage node is decreased to 3 V due to coupling. The sense margin for the "H" data in read access is lower than the initial "H" data voltage of 4 V. To the contrary, when the cell plate potential VPL increases in data write access, the sense margin for "L" data decreases.

In this manner, when a stable cell plate potential VPL is not supplied, the sense margin for data read access is reduced. In the worst case, data different from written identical data may be read out.

SUMMARY OF THE INVENTION

It is, therefore, an object of the present invention to provide a semiconductor integrated circuit capable of supplying a stable DC and transient intermediate potential.

To achieve the object of the present invention, there is provided a semiconductor integrated circuit comprising: a reference potential generation circuit for generating a reference potential; a first MOS transistor of a first conductivity type having a gate connected to an output terminal of the reference potential generation circuit, and a source connected to an output node; a first load circuit provided between a first potential supply source and a drain of the first MOS transistor; a transfer circuit for transferring a logic state of a connection point between the first MOS transistor and the first load circuit; and a second MOS transistor of a second conductivity type having a source connected to the first potential supply source, a drain connected to the output node, and a gate which receives an output from the transfer circuit, wherein the output node outputs an intermediate potential on the basis of a potential of the first potential supply source.

With this arrangement, when the potential of the output node is substantially equal to the reference potential output from the reference potential generation circuit, the second MOS transistor is in an inactive state. When the potential of the output node is lower (or higher) than the reference potential output from the reference potential generation circuit, the second MOS transistor is activated until the output from the transfer circuit is inverted, thereby charging (or discharging) the output node with a large current. For this reason, good response characteristics against a small transient variation in intermediate potential, and a stable DC and transient intermediate potential can be obtained.

In addition, to achieve the above object of the present invention, there is provided a semiconductor integrated circuit comprising: a first reference potential generation circuit for generating a first reference potential; a first MOS transistor of a first conductivity type having a gate connected to an output terminal of the first reference potential generation circuit, and a source connected to an output node; a first load circuit provided between a first potential supply source and a drain of the first MOS transistor; a first transfer circuit for transferring a logic state of a connection point between the first MOS transistor and the first load circuit; a second MOS transistor of a second conductivity type having a source connected to the first potential supply source, a drain connected to the output node, and a gate which receives an output from the first transfer circuit; a second reference potential generation circuit for generating a second reference potential; a third MOS transistor of the second conductivity type having a gate connected to an output terminal of the second reference potential generation circuit, and a source connected to the output node; a second load circuit provided between a second potential supply source and a drain of the third MOS transistor; a second transfer circuit for transferring a logic state of a connection point between the third MOS transistor and the second load circuit; and a fourth MOS transistor of the first conductivity type having a source connected to the second potential supply source, a drain connected to the output node, and a gate which receives an output from the second transfer circuit, wherein the output node outputs an intermediate potential between a potential of the first potential supply source and a potential of the second potential supply source.

With this arrangement, when the potential of the output node is higher than the first reference potential output from the first reference potential generation circuit, the second MOS transistor is in an inactive state. When the potential of the output node is lower than the first reference potential output from the first reference potential generation circuit, the second MOS transistor is activated until the output from the first transfer circuit is inverted, thereby charging the output node with a large current. Further, when the potential of the output node is lower than the second reference potential output from the second reference potential generation circuit, the fourth MOS transistor is in an inactive state. When the potential of the output node is higher than the second reference potential output from the second reference potential generation circuit, the fourth MOS transistor is activated until the output from the second transfer circuit is inverted, thereby discharging the output node with a large current. For this reason, good response characteristics against a small transient variation in intermediate potential, and a stable DC and transient intermediate potential can be obtained.

Still further, to achieve the above object of the present invention, there is provided a semiconductor integrated circuit comprising: an intermediate potential generation circuit for generating an intermediate potential; a detection circuit for detecting a variation in intermediate potential output from the intermediate potential generation circuit; a charge circuit for charging an output terminal of the intermediate potential generation circuit when the detection circuit detects a decrease in intermediate potential output from the intermediate potential generation circuit; and a discharge circuit for discharging the output terminal of the intermediate potential generation circuit when the detection circuit detects an increase in intermediate potential output from the intermediate potential generation circuit.

With this arrangement, when the detection circuit detects a decrease in intermediate potential output from the intermediate potential generation circuit, the charge circuit charges the output terminal of the intermediate potential generation circuit. When the detection circuit detects an increase in intermediate potential, the discharge circuit discharges the output terminal of the intermediate potential generation circuit. For this reason, good response characteristics against a small transient variation in intermediate potential, and a stable DC and transient intermediate potential can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a circuit diagram showing a semiconductor integrated circuit according to the first embodiment of the present invention;

FIGS. 5A to 5C are circuit diagrams each showing only a load element and some circuits near the load element for explaining other arrangements of a load element in the circuit of the first embodiment shown in FIG. 4;

FIG. 6 is a circuit diagram showing a modification of the circuit of the first embodiment shown in FIG. 4;

FIG. 7 is a circuit diagram showing a semiconductor integrated circuit according to the second embodiment of the present invention;

FIGS. 8A to 8C are circuit diagrams each showing only a load element and some circuits near the load element for explaining other arrangements of a load element in the circuit of the second embodiment shown in FIG. 7;

FIG. 9 is a circuit diagram showing a modification of the circuit of the second embodiment shown in FIG. 7;

FIG. 10 is a circuit diagram showing a semiconductor integrated circuit according to the third embodiment of the present invention;

FIG. 11 is a diagram showing the voltage-current characteristics of an output node in the circuit of the third embodiment shown in FIG. 10;

FIG. 17 is a circuit diagram showing a semiconductor integrated circuit according to the fifth embodiment of the present invention;

FIGS. 20A and 20B are circuit diagrams showing other arrangements of a transfer circuit in the circuits shown in FIGS. 17 and 18;

FIG. 21 is a circuit diagram showing a circuit used as a DRAM cell plate potential generation circuit for explaining a practical application of the semiconductor integrated circuits described in the first to fifth embodiments; and FIG. 22 is a circuit diagram showing a circuit used as a DRAM bit line precharge potential generation circuit for explaining a practical application of the semiconductor integrated circuits described in the first to fifth embodiments.

DETAILED DESCRIPTION OF THE PREFERRED EMBODIMENTS

[First Embodiment]

Figure 1:
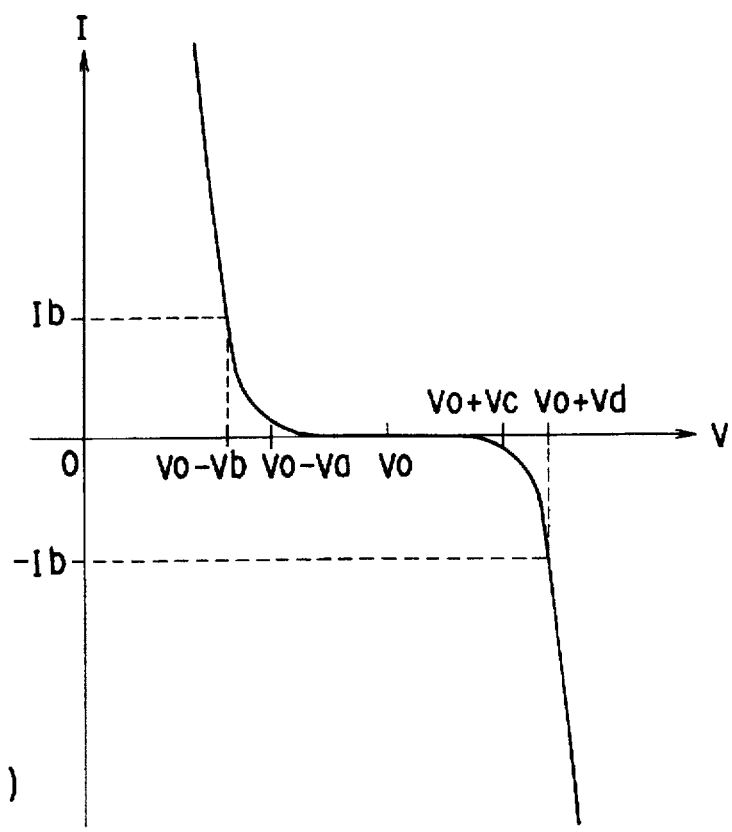
FIG. 1 is a diagram showing the voltage-current characteristics of an output node in a conventional intermediate potential generation circuit.

FIG. 4 is a circuit diagram showing a semiconductor integrated circuit according to the first embodiment of the present invention. The semiconductor integrated circuit of the first embodiment is constituted by an N-channel MOS transistor (NMOS transistor) N11, P-channel MOS transistors (PMOS transistors) P12 and P13, inverter circuits I11 and I12, and a reference potential generation circuit K1. The reference potential generation circuit K1 is constituted by an NMOS transistor N2 and a PMOS transistor P3. The gate and drain of the NMOS transistor N2 are connected to a node L2, and the source is connected to a node L4. A predetermined potential V4 is applied to this node L4. Alternatively, the node L4 is connected to another circuit, and an identical potential is applied to the node L4. The PMOS transistor P3 serves as a load element. The current path of the PMOS transistor P3 is inserted between a power supply Vcc and the node L2, and the gate is connected to a ground point Vss. The potential of the output node L2 in the reference potential generation circuit K1 is set to an intermediate potential V2 between the potentials of the power supply Vcc and the node L4 by the transistors P3 and N2. The source, drain, and gate of the NMOS transistor N11 are respectively connected to an output node L1, a node L11, and the node L2, thereby controlling the gate of the NMOS transistor N11 with the potential V2. The PMOS transistor P12 serves as a load element. The current path of the PMOS transistor P12 is inserted between a power supply Vcc and the node L11, and the gate is connected to a ground point Vss. The inverter circuit I11 inverts the potential of the node L11 to output the inverted potential to a node L12. The inverter circuit I12 inverts the potential of this node L12 to output the inverted potential to a node L13. The source, drain, and gate of the PMOS transistor P13 are respectively connected to a power supply Vcc, the output node L1, and the node L13, thereby controlling the gate of the PMOS transistor P13 with the potential of the node L13.

The circuit operation of the first embodiment will be described below. Referring to FIG. 4, the channel width/channel length (W/L) ratio of the PMOS transistor P3 is set equal to that of the NMOS transistor N2 while the W/L ratio of the PMOS transistor P12 is set equal to that of the NMOS transistor N11. The gate and drain of the NMOS transistor N2 have the same potentials as those of the gate and drain of the NMOS transistor N11. Therefore, a DC potential (V4) of the node L4, to which the source of the NMOS transistor N2 is connected, is set equal to a DC potential (V1) of the node L1, to which the source of the NMOS transistor N11 is connected. When the potential V1 decreases, and a potential difference between the potentials V2 and V1 exceeds the threshold voltage of the NMOS transistor N11, the NMOS transistor N11 is set in an active state, and a potential (V11) of the node L11 starts to decrease. When the potential V11 decreases to the inversion potential of the inverter circuit I11, the inverter circuit I11 outputs "H" level to the node L12. Upon reception of this output, the inverter circuit I12 outputs "L" level to the node L13. With this output, the PMOS transistor P13 is set in an active state to charge the output node L1.

When the potential V1 is recovered, and the potential V11 is recovered to the inversion potential of the inverter circuit I11 with the recovery of the potential V1, the inverter circuit I11 outputs "L" level to the node L12. This "L" level is transferred to the gate of the PMOS transistor P13 to stop the charge operation by the transistor P13.

In the first embodiment, with the above circuit operation, the potential V1 can be maintained almost equal to the potential V4. By the impedance of the PMOS transistor P12, a current flowing through the current path of this transistor can be controlled. By adjusting the potential of the node L11 and adjusting the circuit threshold value of the inverter circuit I11, the response characteristics of the circuit against a variation in potential V1 can be adjusted.

FIGS. 5A to 5C are circuit diagrams for explaining other arrangements of the load element (PMOS transistor P12) in the circuit shown in FIG. 4, and each shows only a load element and a circuit section of the NMOS transistor N11. Each circuit realizes the same function as in the arrangement shown in FIG. 4 by using a substitute of the load element in FIG. 4, i.e., the PMOS transistor P12. In FIG. 5A, a resistor R11 having a relatively large resistance value is used instead of the PMOS transistor P12. In FIG. 5B, an NMOS transistor N14 having a gate and drain commonly connected to the power supply Vcc is used instead of the PMOS transistor P12. In FIG. 5C, a PMOS transistor P15 having a gate and drain commonly connected to the node L11 is used instead of the PMOS transistor P12.

Substantially the same operation effect as in FIG. 4 can be obtained even if each of the load elements shown in FIGS. 5A to 5C is used instead of the load element in FIG. 4.

FIG. 6 shows a modification of the circuit shown in FIG. 4. An NMOS transistor N1 which has the drain, source and gate respectively connected to a power supply Vcc, the output node L1, and the node L2 is added to the circuit shown in FIG. 4 to obtain a circuit in FIG. 6. Since the remaining arrangement in FIG. 6 is the same as in the circuit shown in FIG. 4, the same reference numerals as in FIG. 4 denote the same parts in FIG. 6, and a detailed description thereof will be omitted.

In the arrangement shown in FIG. 6, when the potential V1 of the output node L1 decreases, and a potential difference between the potential V2 of the node L2 and the potential V1 exceeds the threshold voltage of the NMOS transistor N1, this NMOS transistor N1 is set in an active state to charge the node L1 by the power supply Vcc through the NMOS transistor N1, together with the charge through the PMOS transistor P13. As shown in FIG. 1, when the variation amount of the potential V1 is small, and the potential difference between the potentials V1 and V2 is about the threshold voltage of the NMOS transistor N1 (around V0-Va), a charge current of the NMOS transistor N1 for the output node L1 is very small due to the transistor characteristics of the NMOS transistor N1. However, a charge current for this range can also be supplied from the PMOS transistor P13. On the other hand, when the variation amount of the potential V1 becomes larger, the charge operation can be performed by this transistor N1 with a sufficient current amount (e.g., I=-Ib at V0-Vb). For this reason, the recovery function with respect to a large variation in potential V1 can be enhanced compared to the circuit shown in FIG. 4.

[Second Embodiment]

FIG. 7 is a circuit diagram showing a semiconductor integrated circuit according to the second embodiment of the present invention. The semiconductor integrated circuit of the second embodiment is constituted by a PMOS transistor P11, NMOS transistors N12 and N13, inverter circuits I13 and I14, and a reference potential generation circuit K2. The reference potential generation circuit K2 is constituted by a PMOS transistor P2 and an NMOS transistor N3. The gate and drain of the PMOS transistor P2 are connected to a node L3, and the source is connected to a node L4. A predetermined potential V4 is applied to this node L4. Alternatively, the node L4 is connected to another circuit, and an identical potential is applied to the node L4. The NMOS transistor N3 serves as a load element. The current path of the NMOS transistor N3 is inserted between a ground point Vss and the node L3, and the gate is connected to the ground point Vss. With this arrangement, the potential of the node L3 is set to an intermediate potential V3 between the potential V4 of the node L4 (e.g., a power supply Vcc) and the potential of the ground point Vss. The source, drain, and gate of the PMOS transistor P11 are respectively connected to an output node L1, a node L14, and the node L3, thereby controlling the gate of the PMOS transistor P11 with the potential V3. The NMOS transistor N12 serves as a load element. The current path of the NMOS transistor N12 is inserted between a ground point Vss and the node L14, and the gate is connected to a power supply Vcc. The inverter circuit I13 inverts the potential of the node L14 to output the inverted potential to a node L15. The inverter circuit I14 inverts the potential of this node L15 to output the inverted potential to a node L16. The source, drain, and gate of the NMOS transistor N13 are respectively connected to a ground point Vss, the output node L1, and the node L16, thereby controlling the gate of the NMOS transistor N13 with the potential of this node L16.

The circuit operation of the second embodiment will be described below. Referring to FIG. 7, the W/L ratio of the NMOS transistor N3 is set equal to that of the PMOS transistor P2 while the W/L ratio of the NMOS transistor N12 is set equal to that of the PMOS transistor P11. The gate and drain of the PMOS transistor P2 have the same potentials as those of the gate and drain of the PMOS transistor P11. Therefore, the DC potential V4 of the node L4, to which the source of the PMOS transistor P2 is connected, is set equal to a DC potential V1 of the node L1, to which the source of the PMOS transistor P11 is connected. When the potential V1 increases, and a potential difference between the potential V1 and the potential V3 exceeds the absolute value of the threshold voltage of the PMOS transistor P11, the PMOS transistor P11 is set in an active state, and a potential V14 of the node L14 starts to increase. When the potential V14 increases to the inversion potential of the inverter circuit I13, the inverter circuit I13 outputs "L" level to the node L15. Upon reception of this output, the inverter circuit I14 outputs "H" level to the node L16. With this output, the NMOS transistor N13 is activated to discharge the output node L1.

When the potential V1 is recovered, and the potential V14 is recovered to the inversion potential of the inverter circuit I13 with the recovery of the potential V1, the inverter circuit I13 outputs "H" level to the node L15. This "H" level is inverted by the inverter circuit I14 and transferred to the gate of the NMOS transistor N13 to stop the discharge operation by the transistor N13.

In the second embodiment, with the above-mentioned circuit operation, the output potential V1 can be maintained almost equal to the potential V4. By the impedance of the NMOS transistor N12, a current flowing through the current path of this transistor can be controlled. By adjusting the potential of the node L14 and adjusting the circuit threshold value of the inverter circuit I13, the response characteristics of the circuit against a variation in output potential V1 can be adjusted.

FIGS. 8A to 8C are circuit diagrams for explaining other arrangements of the load element (NMOS transistor N12) in the circuit shown in FIG. 7, and each shows only a load element and a circuit section of the PMOS transistor P11. Each circuit realizes the same function as in the arrangement shown in FIG. 7 by using a substitute of the load element in FIG. 7, i.e., the NMOS transistor N12. In FIG. 8A, a resistor R12 having a relatively large resistance value is used instead of the NMOS transistor N12. In FIG. 8B, a PMOS transistor P14 having a gate and drain commonly connected to a ground point Vss is used instead of the NMOS transistor N12. In FIG. 8C, an NMOS transistor N15 having a gate and drain commonly connected to the node L12 is used instead of the NMOS transistor N12.

Substantially the same operation effect as in FIG. 7 can be obtained even if each of the load elements shown in FIGS. 8A to 8C is used instead of the load element in FIG. 7.

FIG. 9 shows a modification of the circuit shown in FIG. 7. A PMOS transistor P1 which has the drain, source and gate respectively connected to a ground point Vss, the output node L1, and the node L3 is added to the circuit shown in FIG. 7 to obtain a circuit in FIG. 9. Since the remaining arrangement is the same as in the circuit shown in FIG. 7, the same reference numerals as in FIG. 7 denote the same parts in FIG. 9, and a detailed description thereof will be omitted.

In the arrangement shown in FIG. 9, when the potential V1 of the output node L1 increases, and a potential difference between the potential V1 and the potential V3 of the node L3 exceeds the absolute value of the threshold voltage of the PMOS transistor P1, this PMOS transistor P1 is set in an active state to discharge the node L1 to ground point Vss through the PMOS transistor P1, in addition to the discharge operation through the NMOS transistor N13. As shown in FIG. 1, when the variation amount of the potential V1 is small, and the potential difference between the potentials V1 and V3 is about the threshold voltage of the PMOS transistor P1 (around V0+Vc), a discharge current of the PMOS transistor P1 for the output node L1 is very small due to the transistor characteristics of the PMOS transistor P1. However, a discharge current for this range can also be supplied from the NMOS transistor N13. On the other hand, when the variation amount becomes larger, the discharge operation can be performed by this transistor P1 with a sufficient current amount (e.g., I=−Id around V0+Vd). For this reason, the recovery function against a large variation in potential V1 can be enhanced compared to the circuit shown in FIG. 7.

[Third Embodiment]

FIG. 10 is a circuit diagram showing a semiconductor integrated circuit according to the third embodiment of the present invention. The semiconductor integrated circuit of the third embodiment is constituted by circuits S1 and S2. The circuit S1 has the same circuit arrangement as in the first embodiment shown in FIG. 4, and the circuit S2 has the same circuit arrangement as in the second embodiment shown in FIG. 7. For this reason, a description of a connection relationship of elements will be omitted.

The circuit operation of the third embodiment will be described below. Referring to FIG. 10, the gate of an NMOS transistor N11 in the circuit S1 has the same potential as those of the gate and drain of an NMOS transistor N2 while the gate of a PMOS transistor P11 in the circuit S2 has the same potential as those of the gate and drain of a PMOS transistor P2. Therefore, a DC intermediate potential V1 of an output node L1 is the same as a DC potential V4 of a node L4.

When the output potential (intermediate potential) V1 decreases, and a potential difference between the potentials V2 and V1 exceeds the threshold voltage of the NMOS transistor N11, the NMOS transistor N11 is activated, and a potential V11 of a node L11 starts to decrease. When the potential V11 decreases to the inversion potential of an inverter circuit Ill, the inverter circuit Ill outputs "H" level to a node L12. Upon reception of this output, an inverter circuit I12 outputs "L" level to a node L13. With this output, the PMOS transistor P13 is activated to charge the node L1.

At this time, since a potential difference between the potentials V1 and V3 is lower than the absolute value of the threshold voltage of the PMOS transistor P11, the PMOS transistor P11 is turned off, and a potential V14 of a node L14 goes to "L" level. This potential V14 is supplied to the gate of an NMOS transistor N13 through inverter circuits I13 and I14 to turn off the NMOS transistor N13.

When the potential V1 is recovered to almost the potential V4, and the potential V11 returns to the inversion potential of the inverter circuit Ill, the inverter circuit Ill outputs "L" level to the node L12, and the output from the inverter circuit I12 is set in "H" level. Accordingly, the PMOS transistor P13 is turned off to stop the charge operation.

To the contrary, when the potential V1 increases, and the potential difference between the potentials V1 and V3 exceeds the absolute value of the threshold voltage of the PMOS transistor P11, the PMOS transistor P11 is activated, and the potential V14 starts to increase. When the potential V14 increases to the inversion potential of the inverter circuit I13, the inverter circuit I13 outputs "L" level to a node L15. Upon reception of this output, the inverter circuit I14 outputs "H" level to a node L16. With this output, the NMOS transistor N13 is activated to discharge the node L1.

At this time, since a potential difference between the potentials V2 and V1 is smaller than the threshold voltage value of the NMOS transistor N11, the NMOS transistor N11 is turned off, and a potential V11 goes to "H" level to turn off the PMOS transistor P13.

When the potential V1 is recovered to almost the potential V4, and the potential V14 returns to the inversion potential of the inverter circuit I13, the inverter circuit I13 outputs "H" level to the node L15 and this output is inverted by the inverter circuit I14. The inverted output is supplied to the gate of the NMOS transistor N13 to stop the discharge operation.

FIG. 11 shows the voltage-current characteristics of the output node L1 of the semiconductor integrated circuit according to the third embodiment. V1=V0−Va in FIG. 11 is a potential at which a charge operation is started in response to a decrease in intermediate potential V1. As described in the first embodiment, the value Va, i.e., the dead band width of a circuit can be adjusted by adjusting the potential of the node L11 and adjusting the circuit threshold value of the inverter circuit Ill. A charge current before/after this adjustment abruptly increases stepwise, as shown in FIG. 11. Assuming that the minimum current required for recovering a decrease in potential V1 is represented by +Ia, a charge operation can be satisfactorily performed even under the condition of V1=V0−Va by optimizing the size of the PMOS transistor P13 in FIG. 10.

Similarly, as for a discharge operation upon an increase in potential V1, the value Vc can be adjusted by adjusting the potential of the node L14 and adjusting the circuit threshold value of the inverter circuit I13. A discharge operation can be satisfactorily performed under the condition of V1=V0+Vc by optimizing the size of the NMOS transistor N13.

Figure 2:
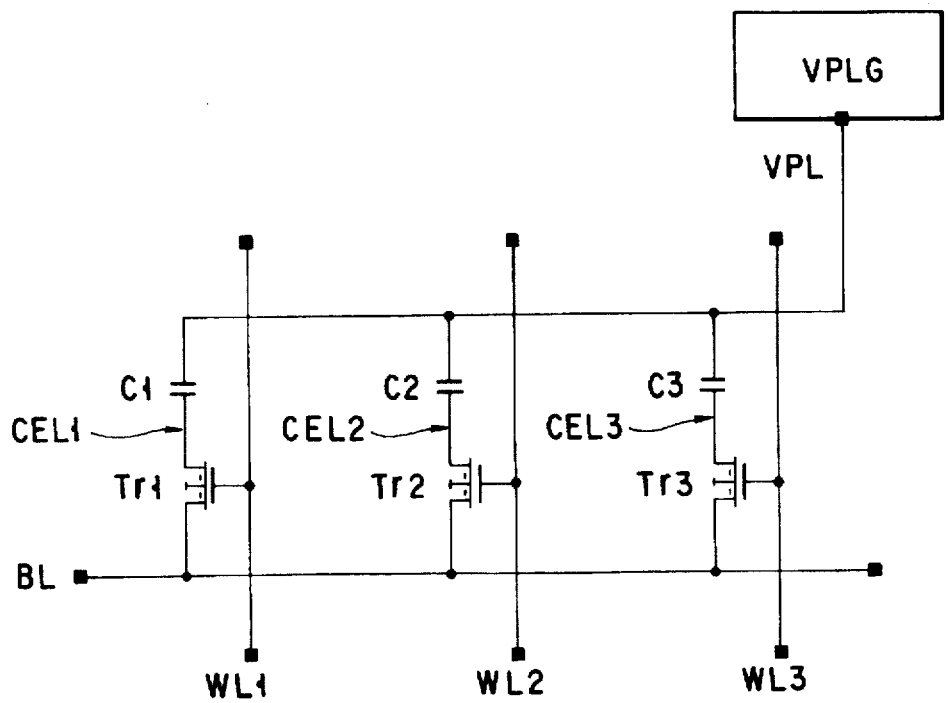
FIG. 2 is a circuit diagram when the conventional intermediate potential generation circuit is used as a DRAM cell plate potential generation circuit.
Figure 3:
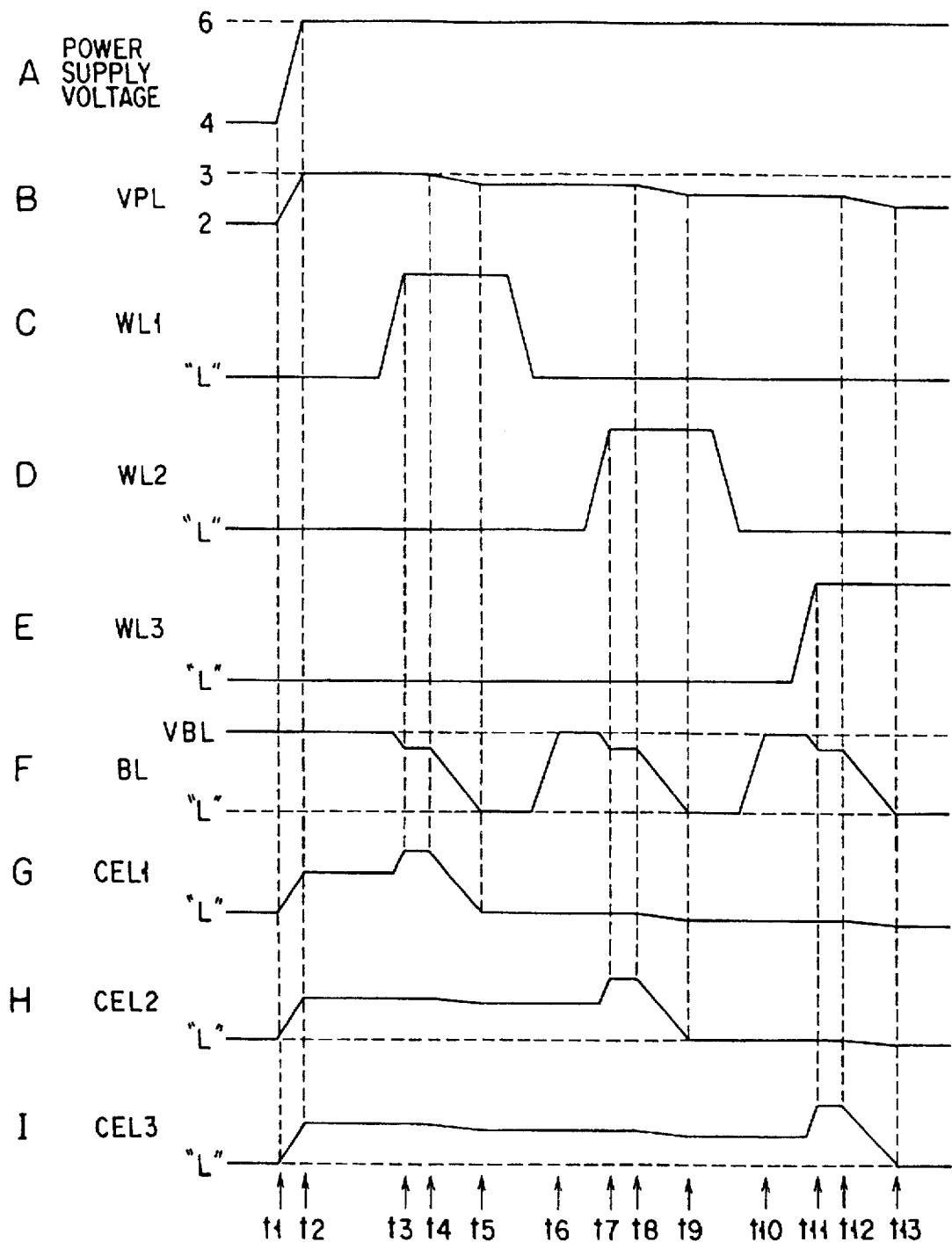
FIGS. 3A–3I are timing charts for explaining the operation of the circuit shown in FIG. 2.
Figure 12A:
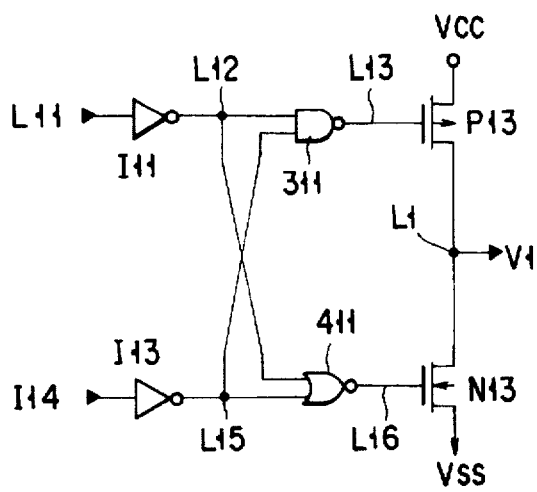
FIGS. 12A and 12B are circuit diagrams showing other arrangements of a transfer circuit in the circuit of the third embodiment shown in FIG. 10.
Figure 12B:
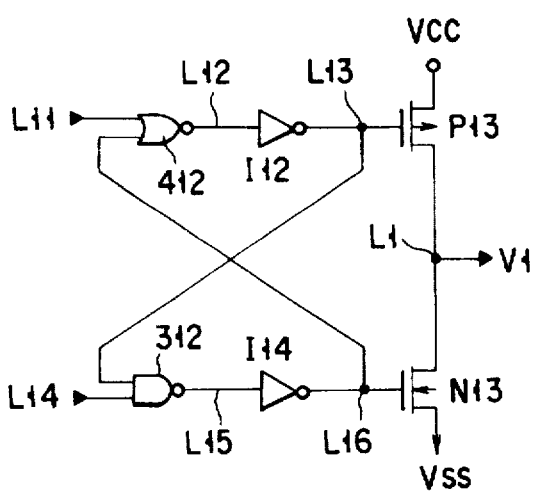

FIGS. 12A and 12B show modifications of the circuit shown in FIG. 10. In FIGS. 12A and 12B, 2-input logic gate circuits are used instead of the inverter circuits I11, I12, I13, and I14 which constitute the circuits S1 and S2 in FIG. 10. More specifically, in FIG. 12A, a 2-input NAND circuit 311 and a 2-input NOR circuit 411 are used instead of the inverter circuit I12 and the inverter circuit I14. The NAND circuit 311 and the NOR circuit 411 are connected to output logic results to the nodes L13 and L16 upon reception of the potentials of the nodes L12 and L15, respectively. Therefore, signals to be transferred to the gates of the PMOS transistor P13 and the NMOS transistor N13 are the same as in the circuit shown in FIG. 10. In addition, the PMOS transistor P13 and the NMOS transistor N13 are not simultaneously set in an active state, so that generation of a through current can be avoided.

In a circuit shown in FIG. 12B, a NOR circuit 412 and a NAND circuit 312 are used instead of the inverter circuit Ill and the inverter circuit I13. The NOR circuit 412 is connected to output a logic result to the node L12 upon reception of the potentials of the nodes L11 and L16. The NAND circuit 312 is connected to output a logic result to the node L15 upon reception of the potentials of the nodes L13 and L14. Therefore, like in FIG. 12A, signals to be transferred to the gates of the PMOS transistor P13 and the NMOS transistor N13 are the same as in the circuit shown in FIG. 10, and generation of a through current is avoided. Further, in the circuit of FIG. 12B, after one of the PMOS transistor P13 and the NMOS transistor N13 is turned off, the other is activated with a short delay. For this reason, a through current can be more accurately avoided than in the circuit shown in FIG. 12A.

Similar to the third embodiment, in both the circuits of FIGS. 12A and 12B, the response characteristics of the circuit against a variation in potential V1 of the node L1 can be adjusted by adjusting the threshold value of the circuit which receives the potentials of the nodes L11 and L14.

[Fourth Embodiment]

Figure 13:
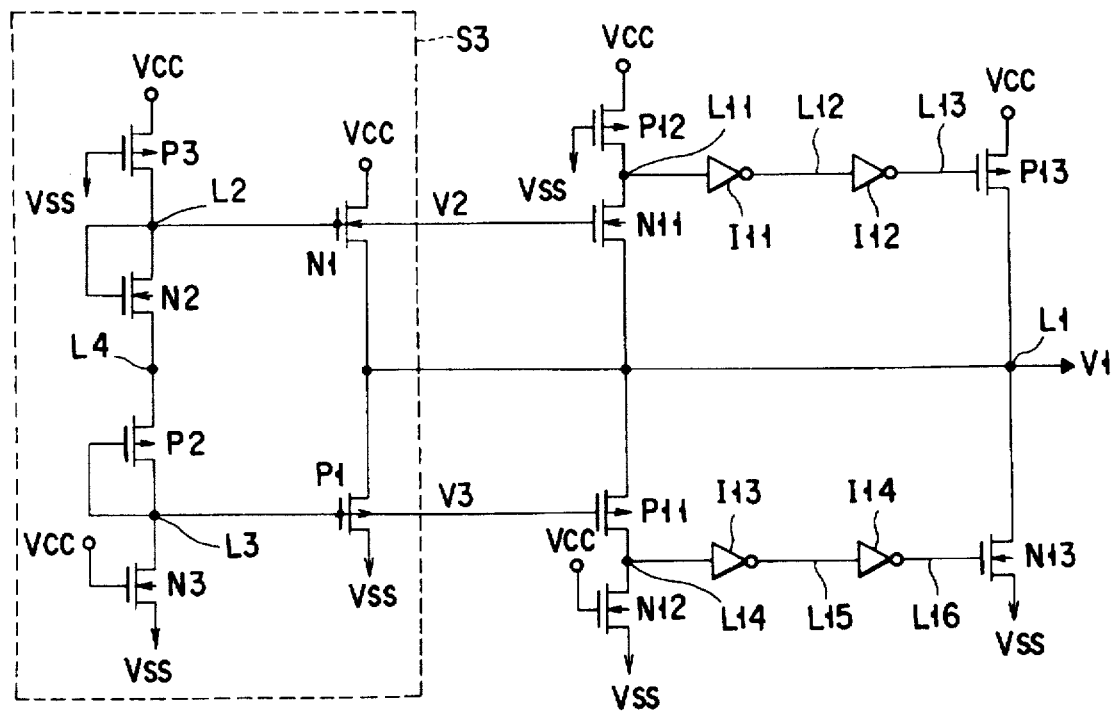
FIG. 13 is a circuit diagram showing a semiconductor integrated circuit according to the fourth embodiment of the present invention.

FIG. 13 is a circuit diagram showing a semiconductor integrated circuit according to the fourth embodiment of the present invention. An NMOS transistor N1 and a PMOS transistor P1 are added to the circuit shown in the third embodiment to obtain the semiconductor integrated circuit of the fourth embodiment.

That is, the source, drain, and gate of the NMOS transistor N1 are respectively connected to a node L1, a power supply Vcc, and a node L2, thereby controlling the gate of the NMOS transistor N1 with a potential V2 of this node L2. The source, drain, and gate of the PMOS transistor P1 are respectively connected to the node L1, a ground point Vss, and a node L3, thereby controlling the gate of the PMOS transistor P1 with a potential V3 of this node L3.

More specifically, referring to FIG. 13, a circuit S3 is constituted by the PMOS transistor P1, PMOS transistors P2 and P3, the NMOS transistor N1, and NMOS transistors N2 and N3. The gate and drain of the PMOS transistor P2 are connected to the node L3, and the source is connected to a node L4. The gate and drain of the NMOS transistor N2 is connected to the node L2, and the source is connected to the node L4 (the source of the PMOS transistor P2). The current path of the PMOS transistor P3 is inserted between a power supply Vcc and the node L2, and the gate is connected to a ground point Vss. The current path of the NMOS transistor N3 is inserted between the node L3 and a ground point Vss, and the gate is connected to a power supply Vcc. The potential V2 of the node L2, the potential V3 of the node L3, and a potential V4 of the node L4 are set to have different intermediate potentials by connecting the current paths of these four transistors P3, N2, P2, and N3 in series. The DC relationship of the power supply Vcc>V2>V4>V3>the ground point Vss is established.

The source, drain, and gate of the NMOS transistor N1 are respectively connected to the node L1, the power supply Vcc, and the node L2, thereby controlling the gate of the NMOS transistor N1 with the potential V2. On the other hand, the source, drain, and gate of the PMOS transistor P1 are respectively connected to the node L1, the ground point Vss, and the node L3, thereby controlling the gate of the PMOS transistor P1 with the potential V3.

The gate potential of the PMOS transistor P1 is equal to that of the PMOS transistor P2 while the gate potential of the NMOS transistor N1 is equal to that of the NMOS transistor N2. Therefore, the DC potential V1 of the node L1 connected to the sources of the PMOS transistor P1 and the NMOS transistor N1 is equal to the DC potential V4 of the node L4 connected to the sources of the PMOS transistor P2 and the NMOS transistor N2.

Assume that the threshold voltage of the NMOS transistor N2 is defined as Vtn1, the threshold voltage of the PMOS transistor P2 is as Vtp1, the threshold voltage of the NMOS transistor N1 is as Vtn2, and the threshold voltage of the PMOS transistor P1 is as Vtp2. The threshold voltages Vtn1, Vtp1, Vtn2, and Vtp2 of the MOS transistors N2, P2, N1, and P1 satisfy conditions "Vtn1<Vtn2" and "|Vtp1|<|Vtp2|". Such conditions are satisfied by connecting, e.g., the back gate of the PMOS transistor P2 to a connection point (node L4) between the MOS transistors N2 and P2 to decrease the threshold voltage Vtp1 of the PMOS transistor P2. The threshold voltages Vtn1, Vtp1, Vtn2, and Vtp2 of the MOS transistors N2, P2, N1, and P1 are set in this manner to prevent the MOS transistors N1 and P1 on the output stage from being simultaneously set in an ON state. The channel widths of the MOS transistors N1 and P1 are set larger than those of the MOS transistors N2 and P2 to obtain a large current driving ability and to return the level to a stable state upon a decrease or increase in output level.

At the nodes L2 and L3, the two different intermediate potentials V2 and V3 having low current driving abilities are generated by the MOS transistors P3, N2, P2, and N3. Assuming that the ON resistance of the MOS transistor P3 is equal to that of the MOS transistor N3, the potential V4 of the node L4 between the MOS transistors N2 and P2 is an intermediate potential between the power supply Vcc and the ground point Vss (if Vss=0V, Vcc/2). Therefore, the potential V2 of the node L2 is a potential which is higher than Vcc/2 by the threshold voltage Vtn1 of the NMOS transistor N2, and the potential V3 of the node L3 is a potential which is lower than Vcc/2 by the absolute value of the threshold voltage Vtp1 of the PMOS transistor P2. The MOS transistors N1 and P1 having high driving abilities are controlled to be rendered conductive by the two different intermediate potentials V2 and V3. If the potential V1 of the node L1 is higher than a value obtained by adding the absolute value of the threshold voltage Vtp2 of the MOS transistor P1 to the potential V3 of the node L3, the MOS transistor P1 is set in an ON state (at this time, the MOS transistor N1 is set in an OFF state) and operates in a direction for decreasing the output potential V1. To the contrary, if the potential V1 of the node L1 is lower than a value obtained by subtracting the threshold voltage Vtn2 of the MOS transistor N1 from the potential V2 of the node L2, the MOS transistor N1 is set in an ON state (at this time, the MOS transistor P1 is set in an OFF state) and operates in a direction for increasing the output potential V1. By repeating these operations, the output potential V1 is set to a potential between the power supply Vcc and the ground point Vss.

In the above arrangement, since the MOS transistors N1 and P1 having high driving abilities on the output stage are not simultaneously set in an ON state, a large through current does not flow from the power supply Vcc to the ground point Vss through the MOS transistors N1 and P1. Further, a through current flowing from the power supply Vcc to the ground point Vss through the current paths of the MOS transistors P3, N2, P2, and N3 can be suppressed to be sufficiently small by setting the ON resistances of the MOS transistors P3 and N3 high.

The circuit operation of the fourth embodiment is a combination of the operation of the circuit S3 and the operation of the third embodiment, which have been described above.

Figure 14:
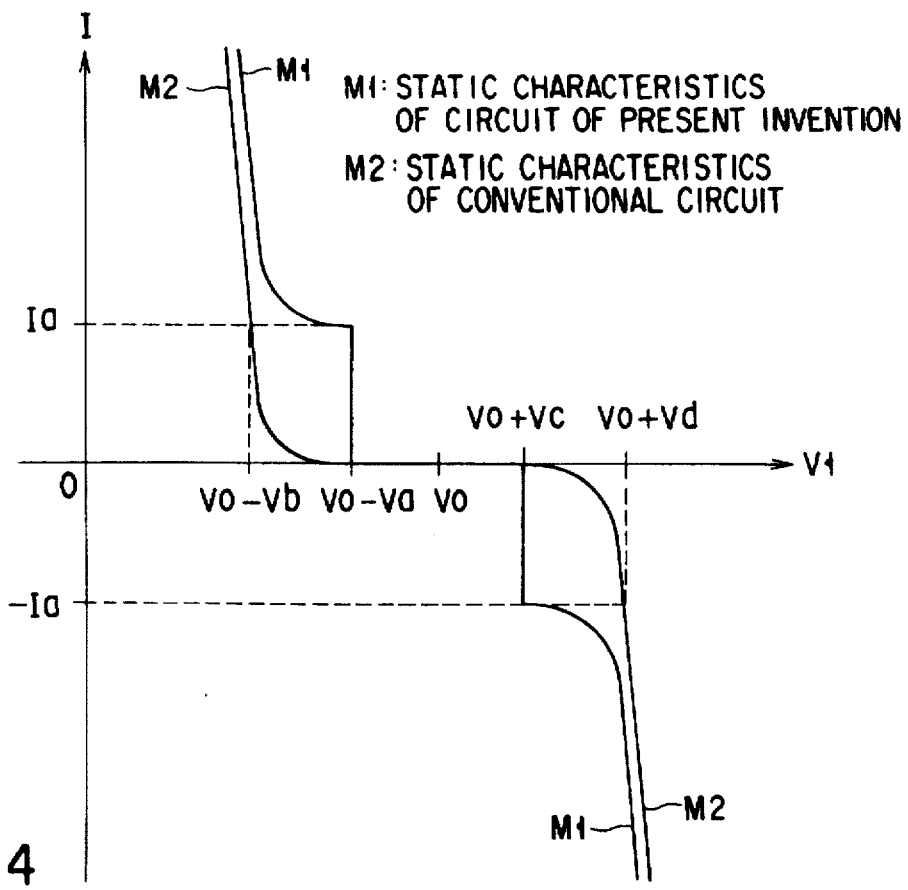
FIG. 14 is a diagram showing the voltage-current characteristics of an output node in the circuit of the fourth embodiment shown in FIG. 13 in comparison with those of the prior art.

FIG. 14 shows the voltage-current characteristics of the node L1 in the intermediate potential generation circuit of the fourth embodiment in comparison with those in a conventional intermediate potential generation circuit (U.S. Pat. No. 4,663,584). V1=V0−Va in FIG. 14 is a potential at which a charge operation is started in response to a decrease in intermediate potential V1. In the conventional circuit, a charge current before/after this potential, which reflects the transistor characteristics of a charge NMOS transistor, gradually increases exponentially, as indicated by a solid line $M_2$. To the contrary, in the circuit of the fourth embodiment, a charge current before/after the above decrease in potential abruptly increases stepwise, as indicated by a solid line $M_1$ because a large charge current is supplied from a PMOS transistor P13 in FIG. 13. Assuming that the minimum current required for recovering a decrease in potential V1 is represented by $+I_a$, a charge operation is not satisfactorily performed in the conventional circuit until the potential V1 decreases to V1=V0+Vb. On the other hand, the circuit of the fourth embodiment is improved such that a charge operation can be satisfactorily performed at V1=V0−Va. Furthermore, when the potential V1 greatly decreases, a charge operation is satisfactorily performed with a charge current increasing exponentially from the NMOS transistor N1 in the fourth embodiment as in the prior art.

To the contrary, as for a potential at which a discharge operation starts in response to an increase in potential V1, a discharge operation is satisfactorily performed at V1=V0+Vd in the fourth embodiment while a discharge operation is not satisfactorily performed until the potential increases to V1=V0+Vd in the prior art.

Figure 15:
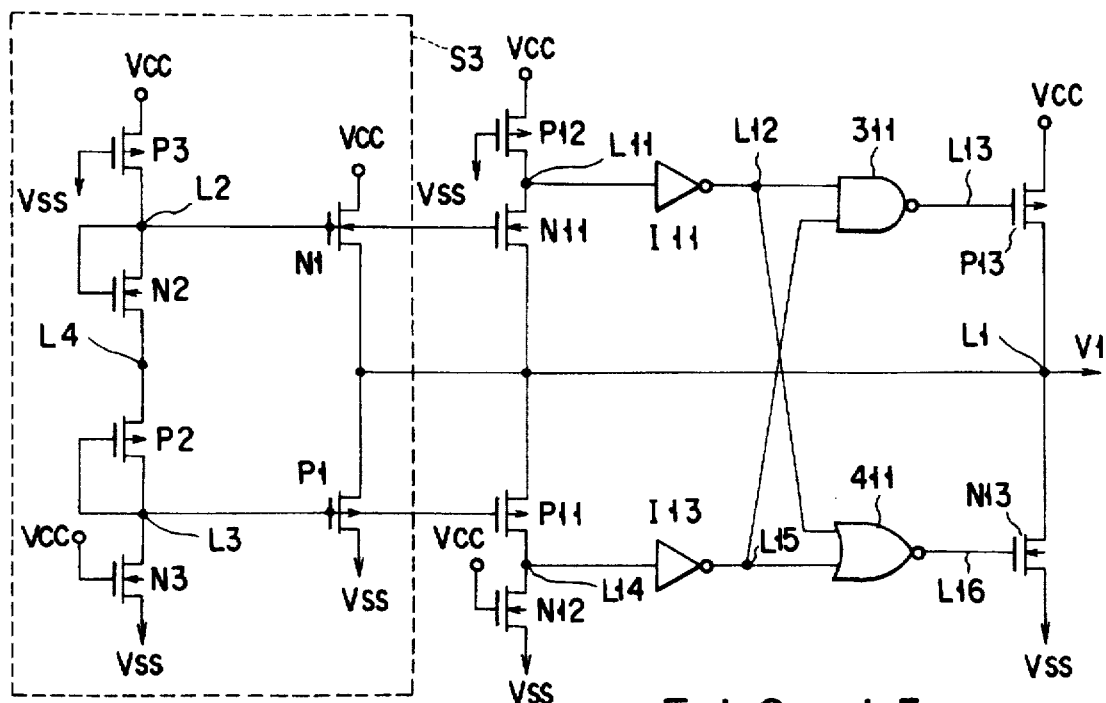
FIGS. 15 and 16 are circuit diagrams respectively showing the arrangements of modifications of the circuit of the fourth embodiment.

Note that, in the fourth embodiment, like in the third embodiment, generation of a through current can be reliably avoided with an arrangement shown in FIG. 15 which employs the circuit arrangement in FIG. 12A. In addition, generation of a through current can be reliably avoided with an arrangement shown in FIG. 16 which employs the circuit arrangement in FIG. 12B.

Figure 16:
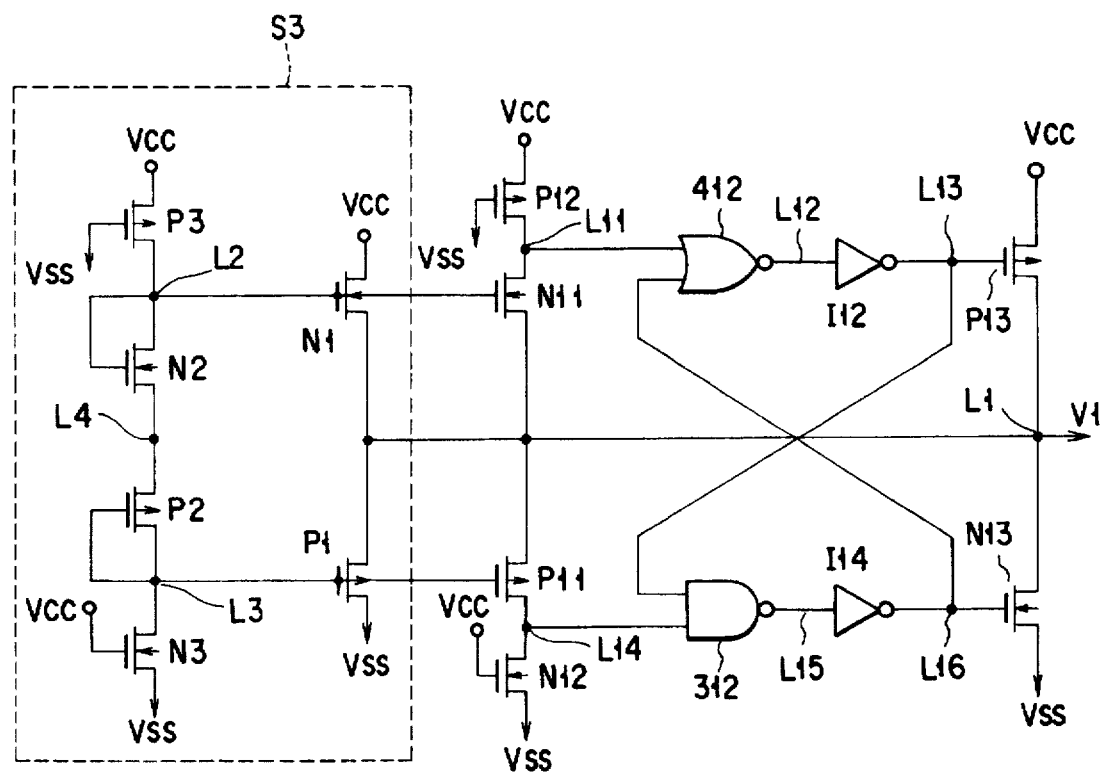

The same reference numerals as in FIGS. 13, 12A, and 12B denote the same parts in FIGS. 15 and 16, and a detailed description thereof will be omitted.

[Fifth Embodiment]

FIG. 17 is a circuit diagram showing a semiconductor integrated circuit according to the fifth embodiment of the present invention. The semiconductor circuit of the fifth embodiment is constituted by a circuit S3 for setting an intermediate potential, a circuit S4 for detecting a variation in intermediate potential, and circuits S5 and S6 for holding the intermediate potential. The circuit S3 has the same arrangement as in the fourth embodiment.

In the fifth embodiment, the circuit S4 for detecting a variation in intermediate potential is constituted by three PMOS transistors P21, P22, and P23, and four NMOS transistors N21, N22, N23, and N24. The PMOS transistor P21 and the NMOS transistor N21 have the same connection relationship as that of a PMOS transistor P1 and an NMOS transistor N1 in the circuit S3. The gates of the PMOS transistor P21 and the NMOS transistor N21 are respectively controlled with a node L3 and a node L2 to generate a reference intermediate potential V21 at a node L21. The sources and gates of the PMOS transistors P22 and P23 are connected to a power supply Vcc and a node L22, respectively. The drain of the transistor P22 is connected to the node L22 while the drain of the transistor P23 is connected to a node L24. The sources of the NMOS transistors N22 and N23 are commonly connected to a node L23. The drain and gate of the transistor N22 are respectively connected to the node L22 and the node L1 while the drain and gate of the transistor N23 are respectively connected to the node L24 and the node L21. The source, drain, and gate of the NMOS transistor N24 are connected to a ground point Vss, the node L23, and the node L22, respectively.

The circuit S5 serves as a charge circuit for an output node L1 and holds an intermediate potential. This circuit S5 is constituted by a PMOS transistor P24, and two inverter circuits I21 and I23. The inverter circuit I21 outputs an inverted signal to a node L25 upon reception of the potential of the node L24. The inverter circuit I23 outputs an inverted signal to a node L27 upon reception of the output from the inverter circuit I21. The current path of the PMOS transistor P24 is connected between a power supply Vcc and the output node L1, and the gate is connected to the node L27 to control the gate of the PMOS transistor P24 with the potential of the node L27.

The circuit S6 serves as a discharge circuit for the output node L1 and holds an intermediate potential. This circuit S6 is constituted by an NMOS transistor N25, and two inverter circuits I22 and I24. The inverter circuit I22 outputs an inverted signal to a node L26 upon reception of the potential of the node L24. The inverter circuit I24 outputs an inverted signal to a node L28 upon reception of the output from the inverter circuit I22. The current path of the NMOS transistor N25 is connected between the output node L1 and a ground point Vss, and the gate is connected to the node L28 to control the gate of the NMOS transistor N25 with the potential of the node L28.

The circuit operation of the fifth embodiment will be described below. Referring to FIG. 17, when the potential of the output node L1 decreases, the potential of the node L1 is lower than that of the node L21, so that the driving ability of the NMOS transistor N22 becomes lower than that of the NMOS transistor N23. In response to this, the potential of the node L22 increases to turn off the PMOS transistors P22 and P23. As a result, the level of the node L24 is lowered. In response to this, the inverter circuit I21 outputs "H" level to the node L25, and the inverter circuit I23 outputs "L" level to the node L27. With this operation, the PMOS transistor P24 is driven to charge the node L1. When the potential of the node L1 is recovered to an almost set value, and a potential difference with respect to the node L21 is substantially eliminated, the driving ability of the NMOS transistor N22 becomes almost equal to that of the NMOS transistor N23, and the potential of the node L24 returns to the original one. In response to this, the charge operation from the PMOS transistor P24 is stopped.

To the contrary, when the potential of the node L1 increases, the potential of the output node L1 is higher than that of the node L21, so that the driving ability of the NMOS transistor N22 becomes higher than that of the NMOS transistor N23. In response to this, the potential of the node L22 is decreased to drive the PMOS transistors P22 and P23. The level of the node L24 increases. With this operation, the inverter circuit I22 outputs "L" level to the node L26, and the inverter circuit I24 outputs "H" level to the node L28. The NMOS transistor N25 is then driven to discharge the node L1. When the potential of the node L1 is recovered to almost the set value, and the potential difference to the node L21 is substantially eliminated, the driving ability of the NMOS transistor N22 becomes almost equal to that of the NMOS transistor N23, and the potential of the node L24 returns to the original one. In response to this, the discharge operation by the NMOS transistor N25 is stopped.

In the fifth embodiment, a variation in output node L1 with respect to the potential of the node L21 is detected as a current difference between the NMOS transistors N22 and N23 and amplified. The amplified value is output as a variation in potential of the node L24. In response to a decrease or increase in potential of this node L24, a charge or discharge operation is performed. Therefore, the currents of the NMOS transistors N22 and N23 are adjusted in accordance with a balance between the sizes of the NMOS transistors N22, N23, and N24 and a balance between the NMOS transistors N22 and N23. Further, the response characteristics of the circuit against a variation in the potential of the node L1 can be adjusted by adjusting the amplitude of the potential of the node L24 and adjusting the circuit threshold values of the inverter circuits I21 and I22 which receive a variation in potential of the node L24.

The voltage-current characteristics of the node L1 in the fifth embodiment, qualitatively indicated by the solid line $M_1$ shown in FIG. 11, are the same as in the fourth embodiment.

Figure 18:
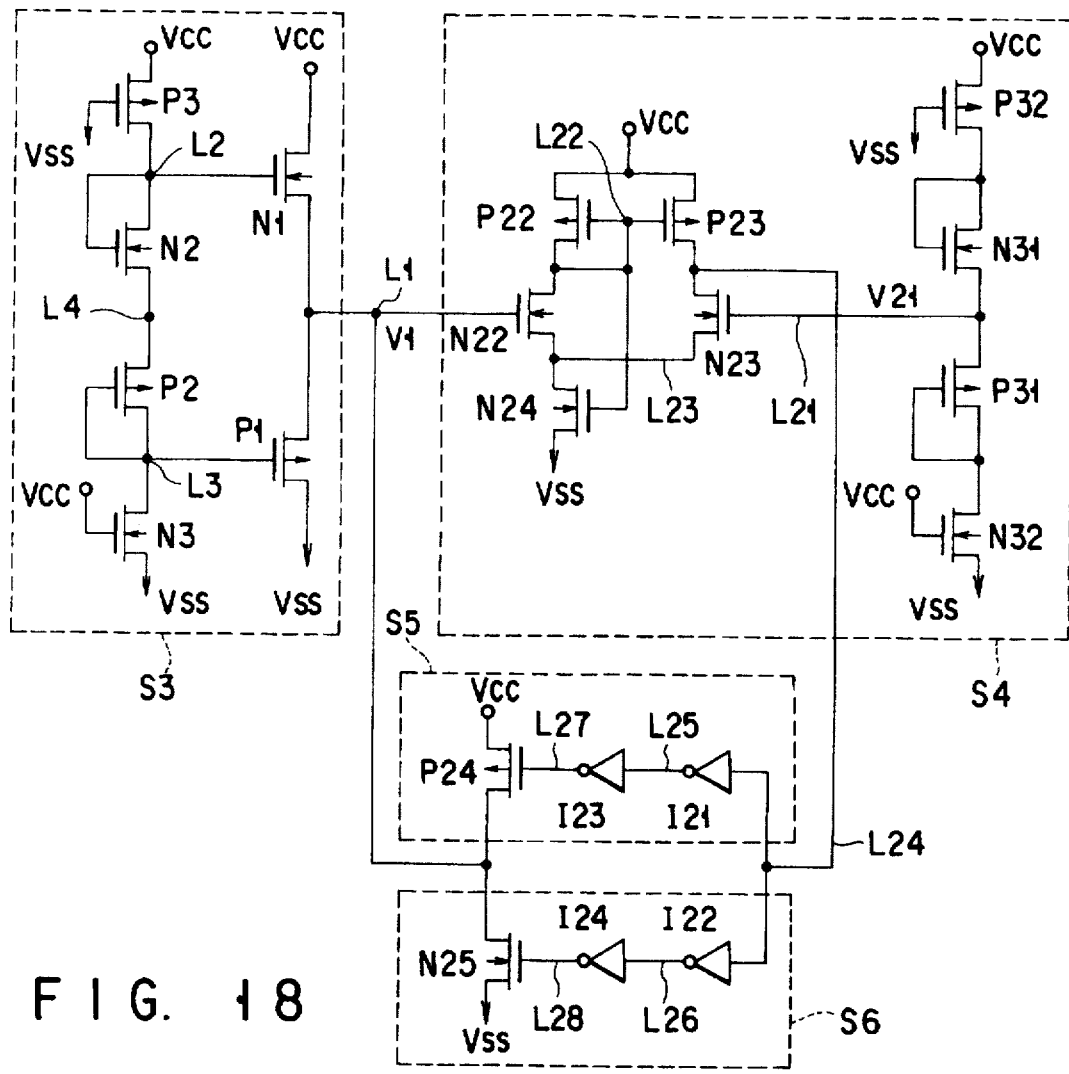
FIG. 18 is a circuit diagram showing a modification of the circuit of the fifth embodiment shown in FIG. 17.

FIG. 18 shows a modification of the circuit shown in FIG. 17. In the circuit shown in FIG. 17, the reference intermediate potential V21 is generated by the NMOS transistor N21 and the PMOS transistor P21. To the contrary, in a circuit shown in FIG. 18, the reference intermediate potential V21 is generated by NMOS transistors N31 and N32, and PMOS transistors P31 and P32. This circuit section is substantially equal to a circuit section constituted by transistors P2, P3, N2, and N3 in the intermediate potential generation circuit S3.

Even with the arrangement shown in FIG. 18, the potential of the node L21 can be set to the reference intermediate potential V21 in the circuit shown in FIG. 17, and substantially the same operation effect as in FIG. 17 can be obtained.

Figure 19:
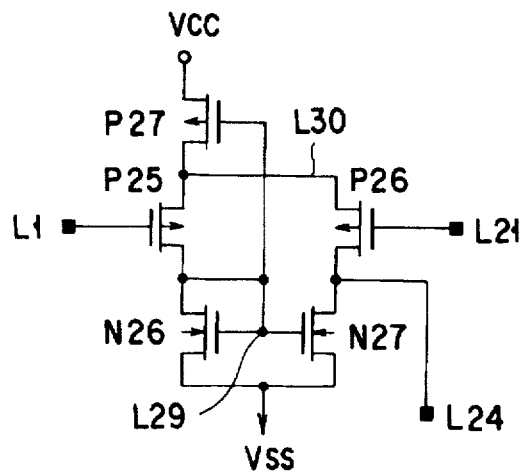
FIG. 19 is a circuit diagram showing another arrangement of a comparison circuit section for explaining a modification of the circuits shown in FIGS. 17 and 18.

FIG. 19 is a circuit diagram for explaining a modification of the circuits shown in FIGS. 17 and 18, and shows another arrangement of the comparison circuit in the circuit S4. In this circuit, PMOS transistors P25 and P26 are arranged instead of the NMOS transistors N22 and N23 in FIGS. 17 and 18. The gates of the PMOS transistors P25 and P26 are connected to the nodes L1 and L21, respectively. Also, a PMOS transistor P27 is arranged instead of the PMOS transistors P22 and P23, and the gate of this PMOS transistor P27 is connected to the drain of the PMOS transistor P25. Further, NMOS transistors N26 and N27 are arranged instead of the NMOS transistor N24, and the gates of these transistors are connected in common and to the drain of the PMOS transistor P25.

With such an arrangement, a comparison operation between the output potential V1 and the reference intermediate potential V21 can be performed as in the circuits shown in FIGS. 17 and 18. A potential variation in output node L1 can be amplified to be output to the node L24.

FIGS. 20A and 20B show modifications of the circuits shown in FIGS. 17 and 18, and show other arrangements of the circuits S5 and S6, respectively. In the circuits shown in FIGS. 20A and 20B, 2-input logic gate circuits are used instead of the inverter circuits which constitute the circuits S5 and S6 in the circuits shown in FIG. 17 and 18. More specifically, in FIG. 20A, a 2-input NAND circuit 321 and a 2-input NOR circuit 421 are used instead of the inverter circuit I23 and the inverter circuit I24, respectively. The NAND circuit 321 and the NOR circuit 421 are connected to respectively output logic results to the nodes L27 and L28, i.e., to the gate of the PMOS transistor P24 and the gate of the NMOS transistor N25 upon reception of the potentials of the nodes L25 and L26. With this arrangement, simultaneous activation of the PMOS transistor P24 and the NMOS transistor N25 can be prevented, and generation of a through current can be avoided.

In the circuit shown in FIG. 20B, a NOR circuit 422 and a NAND circuit 322 are used instead of the inverter circuit I21 and the inverter circuit I22, respectively. The NOR circuit 422 is connected to output a logic result to the node L25 upon reception of the potentials of the nodes L24 and L28 while the NAND circuit 322 is connected to output a logic result to the node L26 upon reception of the potentials of the nodes L24 and L27. The potential of the node L25 is inverted by the inverter circuit I23 to drive the gate of the PMOS transistor P24. The potential of the node L26 is inverted by the inverter circuit I24 to drive the gate of the N-channel MOS transistor N25.

Like in FIG. 20A, generation of a through current can be avoided. Further, in the circuit of FIG. 20B, after one of the PMOS transistor P24 and the NMOS transistor N25 is turned off, the other is activated with a short delay. For this reason, a through circuit can be more accurately avoided than in the circuit shown in FIG. 12A.

Note that, in any one of the circuits related to the fifth embodiment, the response characteristics of the circuit against a variation in potential of the output node L1 can be adjusted by adjusting the amplitude of the potential of the node L24 and adjusting the threshold voltage of the circuit which receives a variation in potential of the node L24.

FIGS. 21 and 22 show practical applications of the semiconductor integrated circuits which are explained in the first to fifth embodiments. A circuit shown in FIG. 21 is used as a DRAM cell plate potential generation circuit. A circuit shown in FIG. 22 is applied to a DRAM bit line precharge potential generation circuit.

Referring to FIG. 21, memory cells comprise a cell transistor Tr1 and a cell capacitor C1, a cell transistor Tr2 and a cell capacitor C2, and a cell transistor Tr3 and a cell capacitor C3, respectively. Word lines WL1 to WL3 are connected to the gates of the cell transistors Tr1 to Tr3, respectively. A bit line BL is commonly connected to the drains of the cell transistors Tr1 and Tr3. Although not shown, a sense amplifier and a precharge potential generation circuit are arranged at an end of the bit line BL. In an initial state, a power supply potential, a cell plate potential VPL, the word lines WL1 to WL3, and the bit line BL are set at 4V, 2V, "L" level, and a precharge potential (VBL), respectively, and "L" level is written in each of cell storage nodes CEL1 to CEL3. As a cell plate potential generation circuit 100, any one of the circuits described in the above embodiments can be applied. The node L1 in the circuit shown in each of the embodiments is connected to one electrode of each of the capacitors C1 to C3, and the intermediate potential V1 output from this node L1 is applied to the capacitors C1 to C3 as the cell plate potential VPL. Note that, in use of the circuits shown in FIGS. 4 to 9, Vcc/2 must be applied to the node L4. The cell plate potential generation circuit 100 can respond to a slight variation in cell plate potential VPL with a sufficiently large current. Therefore, when the cell plate potential VPL varies, the cell plate potential VPL can be recovered to a set value within one refresh cycle. As a result, a decrease in sense margin and a read error in data read access, which are caused by a variation in cell plate potential VPL, can be prevented.

FIG. 22 shows only a pair of bit lines and circuits around the pair of bit lines in a DRAM. Word lines WL1 to WLn are arranged along a direction perpendicular to a pair of bit lines BL and $\overline{BL}$. Memory cells MC are arranged at crossing positions of the pair of bit lines BL and $\overline{BL}$ and the word lines WL1 to WLn. An equalizer circuit EQ is arranged on one end side of the pair of bit lines BL and $\overline{BL}$, and a sense amplifier SA is arranged on the other end side of the pair of bit lines BL and $\overline{BL}$. The equalizer circuit EQ is constituted by NMOS transistors N14 to N16. An equalization signal $\phi_{EQ}$ is supplied to the gates of these NMOS transistors N14 to N16. The current path of the NMOS transistor N14 is connected between the pair of bit lines BL and $\overline{BL}$. One end of the current path of the NMOS transistor N15 is connected to the bit line 10 BL, and one end of the current path of the NMOS transistor N15 is connected to the bit line $\overline{BL}$. The other end of each of the current paths of the NMOS transistors N15 and N16 is connected to the output terminal of a bit line precharge potential generation circuit 200.

Any one of the circuits described in the above embodiments can be applied as the bit line precharge potential generation circuit 200. The node L1 in the circuit shown in each embodiment is connected to the equalizer circuit EQ, and the intermediate potential V1 output from this node L1 is used as the bit line precharge potential (Vcc/2). Note that, in use of the circuits shown in FIGS. 4 to 9, Vcc/2 must be applied to the node L4, as in the circuit shown in FIG. 21. The bit line precharge potential generation circuit 200 supplies the precharge potential of Vcc/2 level to the equalizer circuit EQ, i.e., to the other end of each of the current paths of the NMOS transistors N15 and N16. The equalizer circuit EQ sets the potentials of the pair of bit lines BL and $\overline{BL}$ to Vcc/2 level prior to data read access. The bit line precharge potential generation circuit 200 can respond to a slight variation in output potential (Vcc/2) with a satisfactory large current. Therefore, when this potential varies, the potential can be recovered to a set value within one refresh cycle. As a result, a short in equalization caused by a variation in equalization potential can be prevented, and a read error due to the short in equalization can be avoided.

Note that the present invention is not limited to the above embodiments, and various modifications are deemed to lie within the spirit and scope of the invention. The circuit described in the first embodiment compensates a decrease in output level, the circuit described in the second embodiment compensates an increase in output level, and the circuits described in the third to fifth embodiments compensate both a decrease in output level and an increase in output level. Therefore, when the direction of a variation in output level is obtained in advance, or when only one compensation is required, the circuit of the first or second embodiment having a simple arrangement is used. When the output level may vary in both the decrease and increase directions, the circuit of each of the third to fifth embodiments is used.

As has been described above, according to the present invention, the semiconductor integrated circuit which can supply a stable DC and transient intermediate potential can be obtained.

Particularly, if the semiconductor integrated circuit of the present invention is applied to a cell plate potential generation circuit, a bit line precharge potential generation circuit, or the like in a DRAM, various problems of the DRAM caused by variations in cell plate potential and the bit line precharge potential can be solved.

What is claimed is:

1. A semiconductor integrated circuit, comprising:
 a reference potential generating circuit for generating a reference potential;
 a first MOS transistor of a first conductivity type having a gate connected to an output terminal of said reference potential generating circuit, and a first end connected to an output node;
 a first load provided between a first potential supply source and a second end of said first MOS transistor;
 a transfer circuit for transferring a logic state of a connection point between said first MOS transistor and said first load; and
 a second MOS transistor of a second conductivity type having a first end connected to said first potential supply source, a second end connected to said output node, and a gate which receives an output from said transfer circuit,
 wherein said output node outputs an intermediate potential on the basis of a potential of said first potential supply source, and
 wherein said transfer circuit comprises a first inverter circuit having an input terminal connected to said connection point between said first MOS transistor and said first load, and a second inverter circuit having an input terminal connected to an output terminal of said first inverter circuit and an output terminal connected to said gate of said second MOS transistor.

2. A circuit according to claim 1, wherein said reference potential generating circuit divides a potential difference between the potential of said first potential supply source and a predetermined applied potential to generate the reference potential.

3. A circuit according to claim 1, wherein said reference potential generating circuit comprises a third MOS transistor of the first conductivity type having a gate and a first end connected in common, and a second end to which a predetermined potential is applied, and a second load provided between a connection point between said gate and first end of said third MOS transistor and said first potential supply source, and outputs the reference potential from a connection point between said third MOS transistor and said second load.

4. A circuit according to claim 3, wherein said second load comprises a fourth MOS transistor of the second conductivity type having a first end connected to said first potential supply source, a second end connected to said first end and gate of said third MOS transistor, and a gate connected to a second potential supply source.

5. A circuit according to claim 1, wherein said first load comprises a third MOS transistor of the second conductivity type having a first end connected to said first potential supply source, a second end connected to said second end of said first MOS transistor, and a gate connected to a second potential supply source.

6. A circuit according to claim 1, wherein said first load is constituted by a resistor having a first terminal connected to said first potential supply source, and a second terminal connected to said second end of said first MOS transistor.

7. A circuit according to claim 1, wherein said first load comprises a third MOS transistor of the first conductivity type having a first end and gate connected to said first potential supply source, and a second end connected to said second end of said first MOS transistor.

8. A circuit according to claim 1, wherein said first load comprises a third MOS transistor of the second conductivity type having a first end connected to said first potential supply source, and a second end and gate connected to said second end of said first MOS transistor.

9. A circuit according to claim 1, further comprising a third MOS transistor of the first conductivity type having a first end connected to said first potential supply source, a second end connected to said output node, and a gate connected to said output terminal of said reference potential generating circuit.

10. A circuit according to claim 1, wherein the first conductivity type is an N-channel type, the second conductivity type is a P-channel type, said first potential supply source is a power supply, a second potential supply source is a ground potential, said second MOS transistor is set in an inactive state when a potential of said output node is substantially equal to a predetermined applied potential, and said second MOS transistor is activated until the output from said transfer circuit is inverted to charge said output node when the potential of said output node is lower than the predetermined applied potential.

11. A circuit according to claim 1, wherein the first conductivity type is a P-channel type, the second conductivity type is an N-channel type, said first potential supply source is a ground potential, a second potential supply source is a power supply, said second MOS transistor is set in an inactive state when a potential of said output node is substantially equal to a predetermined applied potential, and said second MOS transistor is activated until the output from said transfer circuit is inverted to discharge said output node when the potential of said output node is higher than the predetermined applied potential.

12. A semiconductor integrated circuit, comprising:

a first reference potential generating circuit for generating a reference potential;

a first MOS transistor of a first conductivity type having a gate connected to an output terminal of said first reference potential generating circuit, and a first end connected to an output node;

a first load provided between a first potential supply source and a second end of said first MOS transistor;

a first transfer circuit for transferring a logic state of a connection point between said first MOS transistor and said first load;

a second MOS transistor of a second conductivity type having a first end connected to said first potential supply source, a second end connected to said output node, and a gate which receives an output from said first transfer circuit;

a second reference potential generating circuit for generating a second reference potential;

a third MOS transistor of the second conductivity type having a gate connected to an output terminal of said second reference potential generating circuit, and a first end connected to said output node;

a second load provided between a second potential supply source and a second end of said third MOS transistor;

a second transfer circuit for transferring a logic state of a connection point between said third MOS transistor and said second load; and a fourth MOS transistor of the first conductivity type having a first end connected to said second potential supply source, a second end connected to said output node, and a gate which receives an output from said second transfer circuit, wherein said output node outputs an intermediate potential between a potential of said first potential supply source and a potential of said second potential supply source, and wherein said first transfer circuit comprises a first inverter circuit having an input terminal connected to said connection point between said first MOS transistor and said first load, and a second inverter circuit having an input terminal connected to an output terminal of said first inverter circuit and an output terminal connected to said gate of said second MOS transistor, and said second transfer circuit comprises a third inverter circuit having an input terminal connected to said connection point between said third MOS transistor and said second load, and a fourth inverter circuit having an input terminal connected to an output terminal of said third inverter circuit and an output terminal connected to said gate of said fourth MOS transistor.

13. A circuit according to claim 12, wherein said first reference potential generating circuit divides a potential difference between the potential of said first potential supply source and the potential of said second potential supply source to generate the first reference potential, said second reference potential generating circuit divides a potential difference between the potential of said first potential supply source and the potential of said second supply source to generate the second reference potential, and the first reference potential is higher than the second reference potential.

14. A circuit according to claim 12, wherein said first reference potential generating circuit comprises a fifth MOS transistor of the first conductivity type having a gate and a first end connected in common, and a third load provided between a connection point between said gate and first end of said fifth MOS transistor and said first potential supply source, said second reference potential generating circuit comprises a sixth MOS transistor of the second conductivity type having a gate and a first end connected in common, and a second end connected to a second end of said fifth MOS transistor, and a fourth load provided between a connection point between said gate and first end of said sixth MOS transistor and said second potential supply second, the first reference potential is output from a connection point between said fifth MOS transistor and said third load, and the second reference potential is output from a connection point between said sixth MOS transistor and said fourth load.

15. A circuit according to claim 14, wherein said third load comprises a seventh MOS transistor of the second conductivity type having a first end connected to said first potential supply source, a second end connected to said first end and gate of said fifth MOS transistor, and a gate connected to said second potential supply source, and said fourth load comprises an eighth MOS transistor of the first conductivity type having a first end connected to said second potential supply source, a second end connected to said first end and gate of said sixth MOS transistor, and a gate connected to said first potential supply source.

16. A circuit according to claim 12, wherein said first load comprises a fifth MOS transistor of the second conductivity type having a first end connected to said first potential supply source, a second end connected to said second end of said first MOS transistor, and a gate connected to said second potential supply source, and said second load comprises a sixth MOS transistor of the first conductivity type having a first end connected to said second potential supply source, a second end connected to said second end of said third MOS transistor, and a gate connected to said first potential supply source.

17. A circuit according to claim 12, wherein said first load comprises a first resistor having a first terminal connected to said first potential supply source, and a second terminal connected to said second end of said first MOS transistor, and said second load comprises a second resistor having a first terminal connected to said second potential supply source, and a second terminal connected to said second end of said third MOS transistor.

18. A circuit according to claim 12, wherein said first load comprises a fifth MOS transistor of the first conductivity type having a first end and gate connected to said first potential supply source, and a second end connected to said second end of said first MOS transistor, and said second load comprises a sixth MOS transistor of the second conductivity type having a first end and gate connected to said second potential supply source, and a second end connected to said second end of said third MOS transistor.

19. A circuit according to claim 12, wherein said first load comprises a fifth MOS transistor of the second conductivity type having a first end connected to said first potential supply source, and a second end and gate connected to said second end of said first MOS transistor, and said second load comprises a sixth MOS transistor of the first conductivity type having a first end connected to said second potential supply source, and a second end and gate connected to said second end of said third MOS transistor.

20. A circuit according to claim 12, further comprising an fifth MOS transistor of the first conductivity type having a first end connected to said first potential supply source, a second end connected to said output node, and a gate connected to said output terminal of said first reference potential generating circuit, and a sixth MOS transistor of the second conductivity type having a first end connected to said second potential supply source, a second end connected to said output node, and a gate connected to said output terminal of said second reference potential generating circuit.

21. A circuit according to claim 12, wherein the first conductivity type is an N-channel type, the second conductivity type is a P-channel type, said first potential supply source is a power supply, said second potential supply source is a ground potential, said second MOS transistor is set in an inactive state when a potential of said output node is higher than the first reference potential output from said first reference potential generating circuit, said second MOS transistor is activated until the output from said first transfer circuit is inverted to charge said output node when the potential of said output node is lower than the first reference potential output from said first reference potential generating circuit, said fourth MOS transistor is set in an inactive state when the potential of said output node is lower than the second reference potential output from said second reference potential generating circuit, and said fourth MOS transistor is activated until the output from said second transfer circuit is inverted to discharge said output node when the potential of said output node is higher than the second reference potential output from said second reference potential generating circuit.

22. A semiconductor integrated circuit, comprising:
a first reference potential generating circuit for generating a first reference potential;
a first MOS transistor of a first conductivity type having a gate connected to an output terminal of said first reference potential generating circuit, and a first end connected to an output node;
a first load provided between a first potential supply source and a second end of said first MOS transistor;
a first transfer circuit for transferring a logic state of a connection point between said first MOS transistor and said first load;
a second MOS transistor of a second conductivity type having a first end connected to said first potential supply second end, a second end connected to said output node, and a gate which receives an output from said first transfer circuit;
a second reference potential generating circuit for generating a second reference potential;
a third MOS transistor of the second conductivity type having a gate connected to an output terminal of said second reference potential generating circuit, and a first end connected to said out-out node;
a second load provided between a second potential supply source and a second end of said third MOS transistor;
a second transfer circuit for transferring a logic state of a connection point between said third MOS transistor and said second load; and
a fourth MOS transistor of the first conductivity type having a first end connected to said second potential supply source, a second end connected to said output node, and a gate which receives an output from said second transfer circuit,
wherein said output node outputs an intermediate potential between a potential of said first potential supply source and a potential of said second potential supply source,
wherein said first transfer circuit comprises a first inverter circuit having an input terminal connected to said connection point between said first MOS transistor and said first load, a NAND circuit having a first input terminal connected to an output terminal of said first inverter circuit and an output terminal connected to said gate of said second MOS transistor, and said second transfer circuit comprises a second inverter circuit having an input terminal connected to said connection point between said third MOS transistor and said second load and an output terminal connected to a second input terminal of said NAND circuit, and a NOR circuit having a first input terminal connected to said output terminal of said second inverter circuit, a second input terminal connected to said output terminal of said first inverter circuit, and an output terminal connected to said gate of said fourth MOS transistor.

23. A semiconductor integrated circuit, comprising:
a first reference potential generating circuit for generating a first reference potential;
a first MOS transistor of a first conductivity type having a gate connected to an output terminal of said first reference potential generating circuit, and a first end connected to an output node;
a first load provided between a first potential supply source and a second end of said first MOS transistor;
a first transfer circuit for transferring a logic state of a connection point between said first MOS transistor and said first load;
a second MOS transistor of a second conductivity type having a first end connected to said first potential supply source, a second end connected to said output node, and a gate which receives an output from said first transfer circuit;
a second reference potential generating circuit for generating a second reference potential;
a third MOS transistor of the second conductivity type having a gate connected to an output terminal of said second reference potential generating circuit, and a first end connected to said output node;
a second load provided between a second potential supply source and a second end of said third MOS transistor;
a second transfer circuit for transferring a logic state of a connection point between said third MOS transistor and said second load; and
a fourth MOS transistor of the first conductivity type having a first end connected to said second potential supply source, a second end connected to said output node, and a gate which receives an output from said second transfer circuit,
wherein said output node outputs an intermediate potential between a potential of said first potential supply source and a potential of said second potential supply source, wherein said first transfer circuit comprises a NOR circuit having a first input terminal connected to said connection point between said first MOS transistor and said first load, a first inverter circuit having an input terminal connected to an output terminal of said NOR circuit, and an output terminal connected to said gate of said second MOS transistor, and said second transfer circuit comprises a NAND circuit having a first input terminal connected to said connection point between said third MOS transistor and said second load, and a second input terminal connected to said output terminal of said first inverter circuit, and a second inverter circuit having an input terminal connected to an output terminal of said NAND circuit, and an output terminal connected to said gate of said fourth MOS transistor and to a second input terminal of said NOR circuit.

24. A semiconductor integrated circuit, comprising:

a dynamic memory; and a cell plate potential generating circuit for generating a potential to be applied to a cell plate of said dynamic memory, said dynamic memory including:

a cell transistor having a first end connected to a bit line, and a gate connected to a word line; and a capacitor having a first electrode connected to a second end of said cell transistor, and said cell plate potential generating circuit including:

a reference potential generating circuit for generating a reference potential;

a first MOS transistor of a first conductivity type having a gate connected to an output terminal of said reference potential generating circuit, and a first end connected to an output node;

a first load provided between a first potential supply source and a second end of said first MOS transistor;

a transfer circuit for transferring a logic state of a connection point between said first MOS transistor and said first load; and a second MOS transistor of a second conductivity type having a first end connected to said first potential supply source, a second end connected to said output node, and a gate which receives an output from said transfer circuit, wherein said output node of said cell plate potential generating circuit is connected to a second electrode of said capacitor to apply an intermediate potential on the basis of a potential of said first potential supply source, wherein said transfer circuit comprises a first inverter circuit having an input terminal connected to said connection point between said first MOS transistor and said first load, and a second inverter circuit having an input terminal connected to an output terminal of said first inverter circuit, and an output terminal connected to said gate of said second MOS transistor.

25. A semiconductor integrated circuit, comprising:

a dynamic memory; and a cell plate potential generating circuit for generating a potential to be applied to a cell plate of said dynamic memory, said dynamic memory including:

a cell transistor having a first end connected to a bit line, and a gate connected to a word line; and a capacitor having a first electrode connected to a second end of said cell transistor, and said cell plate potential generating circuit including:

a first reference potential generating circuit for generating a first reference potential;

a first MOS transistor of a first conductivity type having a gate connected to an output terminal of said first reference potential generating circuit, and a first end connected to an output node;

a first load provided between a first potential supply source and a second end of said first MOS transistor;

a first transfer circuit for transferring a logic state of a connection point between said first MOS transistor and said first load;

a second MOS transistor of a second conductivity type having a first end connected to said first potential supply source, a second end connected to said output node, and a gate which receives an output from said first transfer circuit;

a second reference potential generating circuit for generating a second reference potential;

a third MOS transistor of the second conductivity type having a gate connected to an output terminal of said second reference potential generating circuit, and a first end connected to said output node;

a second load provided between a second potential supply source and a second end of said third MOS transistor;

a second transfer circuit for transferring a logic state of a connection point between said third MOS transistor and said second load; and a fourth MOS transistor of the first conductivity type having a first end connected to said second potential supply source, a second end connected to said output node, and a gate which receives an output from said second transfer circuit, wherein said output node of said cell plate potential generating circuit is connected to a second electrode of said capacitor to apply an intermediate potential between a potential of said first potential supply source and a potential of said second potential supply source, and wherein said first transfer circuit comprises a first inverter circuit having an input terminal connected to said connection point between said first MOS transistor and said first load, and a second inverter circuit having an input terminal connected to an output terminal of said first inverter circuit, and an output terminal connected to said gate of said second MOS transistor, and said second transfer circuit comprises a third inverter circuit having an input terminal connected to said connection point between said third MOS transistor and said second load, and a fourth inverter circuit having an input terminal connected to an output terminal of said third inverter circuit, and an output terminal connected to said gate of said fourth MOS transistor.

26. A semiconductor integrated circuit, comprising:

a dynamic memory; and a bit line precharge potential generating circuit for generating a bit line precharge potential to be applied to said dynamic memory, said dynamic memory including:

a pair of bit lines;

word lines;

dynamic memory cells coupled to said pair of bit lines and said word lines;

a sense amplifier for amplifying a potential difference between said pair of bit lines; and an equalizer circuit for equalizing said pair of bit lines, said bit line precharge potential generating circuit including:

a reference potential generating circuit for generating a reference potential;

a first MOS transistor of a first conductivity type having a gate connected to an output terminal of said reference potential generating circuit, and a first end connected to an output node;

a first load provided between a first potential supply source and a second end of said first MOS transistor;

a transfer circuit for transferring a logic state of a connection point between said first MOS transistor and said first load; and a second MOS transistor of a second conductivity type having a first end connected to said first potential supply source, a second end connected to said output node, and a gate which receives an output from said transfer circuit, wherein said output node of said bit line precharge potential generating circuit is connected to said equalizer circuit to apply an intermediate potential to said equalizer circuit on the basis of a potential of said first potential supply source, and wherein said transfer circuit comprises a first inverter circuit having an input terminal connected to said connection point between said first MOS transistor and said first load, and a second inverter circuit having an input terminal connected to an output terminal of said first inverter circuit, and an output terminal connected to said gate of said second MOS transistor.

27. A circuit according to claim 26, wherein said equalizer circuit comprises a third MOS transistor having first and second ends connected between said pair of bit lines, and a gate which receives an equalization signal, a fourth MOS transistor having a first end connected to a first one of said pair of bit lines, a second end connected to said bit line precharge potential generating circuit, and a gate which receives the equalization signal, and a fifth MOS transistor having a first end connected to a second one of said pair of bit lines, a second end connected to said bit line potential generating circuit, and a gate which receives the equalization signal.

28. A semiconductor integrated circuit, comprising:

a dynamic memory; and a bit line precharge potential generating circuit for generating a bit line precharge potential to be applied to said dynamic memory, said dynamic memory including:

a pair of bit lines;

word lines;

dynamic memory cells coupled to said pair of bit lines and said word lines;

a sense amplifier for amplifying a potential difference between said pair of bit lines; and an equalizer circuit for equalizing said pair of bit lines, said bit line precharge potential generating circuit including:

a first reference potential generating circuit for generating a first reference potential;

a first MOS transistor of a first conductivity type having a gate connected to an output terminal of said first reference potential generating circuit, and a first end connected to an output node;

a first load provided between said first potential supply source and a second end of said first MOS transistor;

a first transfer circuit for transferring a logic state of a connection point between said first MOS transistor and said first load;

a second MOS transistor of a second conductivity type having a first end connected to said first potential supply source, a second end connected to said output node, and a gate which receives an output from said first transfer circuit;

a second reference potential generating circuit for generating a second reference potential;

a third MOS transistor of the second conductivity type having a gate connected to an output terminal of said second reference potential generating circuit, and a first end connected to said output node;

a second load provided between a second potential supply source and a second end of said third MOS transistor;

a second transfer circuit for transferring a logic state of a connection point between said third MOS transistor and said second load; and a fourth MOS transistor of the first conductivity type having a first end connected to said second potential supply source, a second end connected to said output node, and a gate which receives an output from said second transfer circuit, wherein said output node of said bit line precharge potential generating circuit is connected to said equalizer circuit to apply an intermediate potential between a potential of said first potential supply source and a potential of said second potential supply source to said equalizer circuit, and wherein said first transfer circuit comprises a first inverter circuit having an input terminal connected to said connection point between said first MOS transistor and said first load, and a second inverter circuit having an input terminal connected to an output terminal of said first inverter circuit, and an output terminal connected to said gate of said second MOS transistor, and said second transfer circuit comprises a third inverter circuit having an input terminal connected to said connection point between said third MOS transistor and said second load, and a fourth inverter circuit having an input terminal connected to an output terminal of said third inverter circuit, and an output terminal connected to said gate of said fourth MOS transistor.

29. A circuit according to claim 28, wherein said equalizer circuit comprises a fifth MOS transistor having first and second ends connected between said pair of bit lines, and a gate which receives an equalization signal, a sixth MOS transistor having a first end connected to a first one of said pair of bit lines, a second end connected to said bit line precharge potential generating circuit, and a gate which receives the equalization signal, and a seventh MOS transistor having a first end connected to a second one of said pair of bit lines, a second end connected to said bit line potential generating circuit, and a gate which receives the equalization signal.

* * * * *